(12) United States Patent
Shichi et al.

(10) Patent No.: US 9,508,521 B2
(45) Date of Patent: Nov. 29, 2016

(54) ION BEAM DEVICE

(71) Applicant: HITACHI HIGH-TECHNOLOGIES CORPORATION, Tokyo (JP)

(72) Inventors: Hiroyasu Shichi, Tokyo (JP); Shinichi Matsubara, Chofu (JP); Norihide Saho, Tsuchiura (JP); Masahiro Yamaoka, Hachioji (JP); Noriaki Arai, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 7 days.

(21) Appl. No.: 14/328,754

(22) Filed: Jul. 11, 2014

(65) Prior Publication Data
US 2014/0319370 A1   Oct. 30, 2014

Related U.S. Application Data

(63) Continuation of application No. 12/995,700, filed as application No. PCT/JP2009/056485 on Mar. 30, 2009, now Pat. No. 8,779,380.

(30) Foreign Application Priority Data

Jun. 5, 2008 (JP) ................................. 2008-148392

(51) Int. Cl.
*H01J 27/00* (2006.01)
*H01J 27/02* (2006.01)
(Continued)

(52) U.S. Cl.
CPC ............. *H01J 27/022* (2013.01); *H01J 27/26* (2013.01); *H01J 37/023* (2013.01); *H01J 37/067* (2013.01); *H01J 37/08* (2013.01); *H01J 37/26* (2013.01);
(Continued)

(58) Field of Classification Search
None
See application file for complete search history.

(56) References Cited

U.S. PATENT DOCUMENTS 1,221,847 A * 4/1917 Elmstrom et al. ... G03B 17/425
  396/390
3,374,454 A * 3/1968 Holland ................ G01L 1/2287
  338/2

(Continued)

FOREIGN PATENT DOCUMENTS

JP       56-60895 A     5/1981
JP       58-85242 A     5/1983
(Continued)

OTHER PUBLICATIONS

H. Kuo et al., Preparation and Characterization of Single-Atom Tips, Nano Letters, vol. 4, No. 12, pp. 2379-2382, 2004.
(Continued)

*Primary Examiner* — Andrew Smyth
(74) *Attorney, Agent, or Firm* — Mattingly & Malur, PC

(57) ABSTRACT

An ion beam device according to the present invention includes a gas field ion source (1) including an emitter tip (21) supported by an emitter base mount (64), a ionization chamber (15) including an extraction electrode (24) and being configured to surround the emitter tip (21), and a gas supply tube (25). A center axis line of the extraction electrode (24) overlaps or is parallel to a center axis line (14A) of the ion irradiation light system, and a center axis line (66) passing the emitter tip (21) and the emitter base mount (64) is inclinable with respect to a center axis line of the ionization chamber (15). Accordingly, an ion beam device including a gas field ion source capable of adjusting the direction of the emitter tip is provided.

17 Claims, 12 Drawing Sheets

(51) Int. Cl.
  *H01J 27/26* (2006.01)
  *H01J 37/02* (2006.01)
  *H01J 37/067* (2006.01)
  *H01J 37/08* (2006.01)
  *H01J 37/28* (2006.01)
  *H01J 37/26* (2006.01)

(52) U.S. Cl.
  CPC .......... *H01J 37/28* (2013.01); *H01J 2237/002* (2013.01); *H01J 2237/006* (2013.01); *H01J 2237/061* (2013.01); *H01J 2237/0807* (2013.01); *H01J 2237/2803* (2013.01)

(56) References Cited

U.S. PATENT DOCUMENTS

| | | | | |
|---|---|---|---|---|
| 5,055,696 | A * | 10/1991 | Haraichi | H01J 37/228 250/423 R |
| 5,126,571 | A * | 6/1992 | Sakai | H01J 37/3171 250/442.11 |
| 5,261,941 | A * | 11/1993 | Sheinberg | C22C 1/0475 102/501 |
| 5,304,415 | A * | 4/1994 | Kurihara | B32B 5/30 181/284 |
| 5,463,220 | A * | 10/1995 | Young | H01J 49/0022 250/281 |
| 5,504,340 | A * | 4/1996 | Mizumura | H01J 37/3056 250/423 R |
| 5,518,595 | A * | 5/1996 | Yamakage | H01J 37/3056 204/192.34 |
| 5,660,895 | A * | 8/1997 | Lee | C23C 16/401 257/E21.275 |
| 5,811,816 | A * | 9/1998 | Gallagher | F17C 3/085 250/352 |
| 5,885,242 | A * | 3/1999 | Arick | A61F 11/00 128/207.18 |
| 6,014,864 | A * | 1/2000 | Owen | F25D 29/001 165/96 |
| 6,254,851 | B1 * | 7/2001 | Kohno | A61K 49/06 424/1.11 |
| 6,414,848 | B1 * | 7/2002 | Chen | H01L 23/4093 165/185 |
| 6,419,651 | B1 * | 7/2002 | Augustine | A61F 7/007 602/2 |
| 6,538,254 | B1 * | 3/2003 | Tomimatsu | H01J 37/3056 250/442.11 |
| 6,781,125 | B2 * | 8/2004 | Tokuda | G01N 23/225 250/307 |
| 7,095,021 | B2 * | 8/2006 | Shichi | H01J 37/3056 250/307 |
| 8,203,461 | B2 * | 6/2012 | Tubel | E21B 17/20 175/61 |
| 8,339,775 | B2 * | 12/2012 | Degner | G06F 1/1616 312/223.1 |
| 2007/0045534 | A1 * | 3/2007 | Zani | B82Y 10/00 250/309 |
| 2007/0262482 | A1 * | 11/2007 | Halpap | B01D 7/02 264/10 |

FOREIGN PATENT DOCUMENTS

| | | |
|---|---|---|
| JP | 62-114226 A | 5/1987 |
| JP | 64-14848 A | 1/1989 |
| JP | 64-19651 A | 1/1989 |
| JP | 1-221847 A | 9/1989 |
| JP | 2-54851 A | 2/1990 |
| JP | 2-61941 A | 3/1990 |
| JP | 3-74454 B2 | 11/1991 |
| JP | 8-203461 A | 8/1996 |
| JP | 8-339775 A | 12/1996 |
| JP | 10-246523 A | 9/1998 |
| JP | 10246523 A * | 9/1998 |
| JP | 2002-150990 A | 5/2002 |
| JP | 2007-3397 A | 1/2007 |
| JP | 2009-54589 A | 3/2009 |
| WO | 99/05506 A1 | 2/1999 |
| WO | 2009/147894 A1 | 12/2009 |
| WO | 2010/082466 A1 | 7/2010 |

OTHER PUBLICATIONS

J. Morgan et al., An Introduction to the Helium Ion Microscope, Microscopy Today, vol. 14, No. 4, Jul. 2006.

* cited by examiner

ION BEAM DEVICE

This is a continuation of U.S. application Ser. No. 12/995,700, filed on Mar. 10, 2011, which is a 371 National Stage of PCT/JP2009/056485, filed Mar. 30, 2009, which claims priority to JP 2008-148392, filed Jun. 5, 2008. The entire disclosures of all of these applications are hereby incorporated by reference.

TECHNICAL FIELD

The present invention relates to an ion beam device such as an ion microscope and an ion beam processing device, a combined device of the ion beam processing device and the ion microscope, and a combined device of the ion microscope and an electron microscope. The present invention also relates to an analyzing and examining device applied with the ion microscope and the electron microscope.

The entire contents of all citations, patents, and patent applications cited in the present specification are hereby incorporated in the present specification by reference.

BACKGROUND ART

The structure of a sample surface can be observed by irradiating the sample with an electron while scanning and detecting secondary charged particles released from the sample. This is called a scanning electron microscope (hereinafter abbreviated as SEM). The structure of the sample surface can be observed even by irradiating the sample with an ion beam while scanning and detecting secondary charged particles released from the sample. This is called a scanning ion microscope (hereinafter abbreviated as SIM). In particular, if the sample is irradiated with the ion species of light mass such as hydrogen and helium, the sputtering action becomes relatively small and it becomes suitable for observing the sample.

Furthermore, the ion beam has a characteristic of being sensitive to information on the sample surface compared to the electron beam. This is because an excitation region of the secondary charged particle is localized by the sample surface compared to the irradiation of the electron beam. Aberration is generated by a diffraction effect in the electron beam as the property for the wave of the electron cannot be ignored. The diffraction effect can be ignored in the ion beam as the ion beam is heavy compared to the electron.

The information reflecting the structure of the inside of the sample can be obtained by irradiating the sample with the ion beam, and detecting the ion transmitted through the sample. This is called a transmission ion microscope. In particular, if the sample is irradiated with the ion species of light mass such as hydrogen and helium, it becomes suitable for observation as the proportion of the ion that transmits through the sample becomes large.

On the contrary, irradiating the sample with the ion species of heavy mass such as argon, xenon, and gallium is suitable for processing the sample by the sputtering action. In particular, a focused ion beam device (hereinafter referred to as FIB) using a liquid metal ion source (hereinafter referred to as LMIS) is known as an ion beam processing device. Furthermore, a combined FIB-SEM device of the scanning electron microscope (SEM) and the focused ion beam (FIB) is also used in recent years. In the FIB-SEM device, the FIB is irradiated to form a square hole at the desired area so that the cross-section can be SEM observed. The sample can be processed even by generating a gas ion such as argon and xenon with a plasma ion source and a gas field ion source, and irradiating the sample with the same.

In the ion microscope, the gas field ion source is suitable for the ion source. The gas field ion source can generate an ion beam having a narrow energy width. Furthermore, the ion generation source can generate a microscopic ion beam since the size is small.

In the ion microscope, an ion beam of large current density needs to be obtained on the sample to observe the sample at a high signal/noise ratio. To this end, an ion emission angle current density of the gas field ion source needs to be large. The molecular density of the ion material gas (ionized gas) near the emitter tip merely needs to be made large to increase the ion emission angle current density. The gas molecular density per unit pressure is inversely proportional to the temperature of the gas. Thus, the emitter tip is cooled to an extremely low temperature, and the temperature of the gas around the emitter tip is to be lowered. The molecular density of the ionized gas near the emitter tip thus can be made large. The pressure of the ionized gas around the emitter tip can be set to about $10^{-2}$ to 10 Pa.

However, if the pressure of the ion material gas is greater than or equal to ~1 Pa, the ion beam collides with a neutral gas and neutralizes, whereby the ion current lowers. When the number of gas molecules in the gas field ion source increases, the frequency of the gas molecules, the temperature of which is increased by colliding with the vacuum chamber wall of high temperature, which collide with the emitter tip becomes high. The temperature of the emitter tip thus rises and the ion current lowers. To this end, a gas ionization chamber that mechanically surrounds the periphery of the emitter tip is arranged in the gas field ion source. The gas ionization chamber is formed using an ion extraction electrode arranged facing the emitter tip.

Patent document 1 discloses enhancing the ion source characteristics by forming a microscopic projection at the distal end of the emitter tip. Non-patent document 1 discloses forming the microscopic projection at the distal end of the emitter tip using a second metal different from the material of the emitter tip. Non-patent document 2 discloses a scanning ion microscope mounted with the gas field ion source for ion releasing helium.

Patent document 2 discloses a gas field ion source in which a bellows is arranged in the ionization chamber. However, in such gas field ion source, the problem in which the ionization chamber is contacted to room temperature through a sample chamber wall, and the gas supplied to the ionization chamber collides with the sample chamber wall of high temperature is not mentioned. The description related to the inclination of the emitter tip is also not made.

Patent document 3 discloses a gas field ion source arranged with a direction adjustment mechanism for varying the axis direction of the ion source. However, in such gas field ion source, the problem in which the ionization chamber is contacted to room temperature through a sample chamber wall, and the gas supplied to the ionization chamber collides with the sample chamber wall of high temperature is not mentioned. Furthermore, the extraction electrode inclines with the change in axis direction of the ion source.

Patent document 4 discloses a gas field ion source arranged with a switching switch for connecting an extraction electrode high voltage lead-in wire to an emitter tip high voltage lead-in wire. In such gas field ion source, the discharge between the emitter tip and the extraction electrode can be prevented after the so-called conditioning process or an enforced discharging process between the ion source outer wall and the emitter tip.

Patent document 5 discloses a charged beam device in which a vibration proofing tool is arranged between a base plate for mounting the main body of the charged particle device and a device mount. However, the description related to a cooling mechanism of the charged particle source is not made at all in patent document 5.

Patent document 6 proposes a device for observing and analyzing defects, foreign substances, and the like by forming a square hole in the vicinity of an abnormal area of a sample with the FIB and observing the cross-section of the square hole with the SEM device. Patent document 7 proposes a technique of extracting a microscopic sample for transmission electron microscope observation from a bulk sample using the FIB and the probe.

Patent document 1: Japanese Laid-Open Patent Publication No. 58-85242
Patent document 2: Japanese Patent Publication NO. 3-74454
Patent document 3: Japanese Laid-Open Patent Publication No. 62-114226
Patent document 4: Japanese Laid-Open Patent Publication No. 1-221847
Patent document 5: Japanese Laid-Open Patent Publication No. 8-203461
Patent document 6: Japanese Laid-Open Patent Publication No. 2002-150990
Patent document 7: International Patent Publication WO99/05506
Non-patent document 1: H. -S. Kuo, I. -S. Hwang, T. -Y. Fu, J. -Y. Wu, C. -C. Chang, and T. T. Tsong, Nano Letters 4 (2004) 2379.
Non-patent document 2: J. Morgan, J. Notte, R. Hill, and B. Ward, Microscopy Today, Jul. 14 (2006) 24

DISCLOSURE OF THE INVENTION

The gas field ion source including the gas ionization chamber of the prior art has the following problems. Some emitter tips have a nano-pyramid structure in which a microscopic projection is arranged at the distal end. In the emitter tip having such structure, the spread of the angle at which the ion beam is released is only about one degree. The direction of the emitter tip needs to be adjusted in order to irradiate a predetermined position of the sample with such microscopic ion beam. The direction of the emitter tip cannot be easily adjusted since the gas ionization chamber has a fixed structure. Thus an attachment portion of the emitter tip needed to be mechanically adjusted. The direction of the extraction electrode also changes when the position and the direction of the emitter tip are adjusted.

The inventors of the present invention found that a slight inclination of the extraction electrode influences the focusing performance of the ion beam. In other words, a problem in that the resolution of the sample observation degrades by the slight inclination of the extraction electrode was found.

Furthermore, the gas ionization chamber is not a sealed chamber although it has a structure of surrounding the emitter tip using the ion extraction electrode. The ionized gas supplied to the gas ionization chamber thus inevitably leaks. When the ionized gas leaks, the pressure of the ion material gas around the emitter tip lowers, and the ion current lowers. However, no measures have been taken in the prior art for the leakage of the ionized gas from the gas ionization chamber.

In the ion microscope mounted with the gas field ion source, a cooling mechanism for cooling the emitter tip to an extremely low temperature is arranged. Such cooling mechanism includes a vibration source such as a refrigerator pump and a compressor. When the vibration from such vibration source is transmitted to the emitter tip, the sample observation of high resolution becomes impossible.

It is an object of the present invention to provide an ion beam device including a gas field ion source that can adjust the position and the direction of the emitter tip, and that contributes to enhancing the ion source luminance and enhancing the focusing performance of the ion beam.

It is another object of the present invention to provide an ion beam device in which the vibration from the cooling mechanism for the gas field ion source reduces the vibration of the emitter tip enabling the sample observation of high resolution.

It is another further object of the present invention to provide a device for forming a cross-section by processing with an ion beam and observing the cross-section with an ion microscope in place of a device for forming a cross-section by processing the sample with the ion beam and observing the cross-section with an electron microscope, and a method of observing the cross-section.

It is also another further object of the present invention to provide a device that enables the sample observation by the ion beam device, the sample observation by the electron microscope, and an element analysis with one device, an analyzer for observing and analyzing defects, foreign substances, and the like, and an examining device.

According to the present invention, the ion beam device includes a gas field ion source for generating an ion beam, an ion irradiation light system for guiding the ion beam from the gas field source to a sample, and a vacuum chamber for accommodating the gas field ion source and the ion irradiation light system.

The gas field ion source includes an emitter tip for generating the ions, an emitter base mount for supporting the emitter tip, a gas ionization chamber including an extraction electrode arranged facing the emitter tip and being configured to surround the emitter tip, and a gas supply tube for supplying gas to the vicinity of the emitter tip; and a center axis line passing the emitter tip and the emitter base mount is inclinable with respect to a center axis line of the ionization chamber.

According to the present invention, the ion beam device includes the gas field ion source, the vacuum chamber, and the base plate for supporting the sample chamber, where the base plate includes a vibration proofing mechanism for reducing vibration from being transmitted to the gas field ion source, the vacuum chamber, and the sample chamber.

According to the present invention, an ion beam device including a gas field ion source capable of adjusting the position and the direction of the emitter tip is provided.

According to the present invention, an ion beam device in which vibration from a cooling mechanism for the gas field ion source does not influence the emitter tip is provided.

Figure 1:
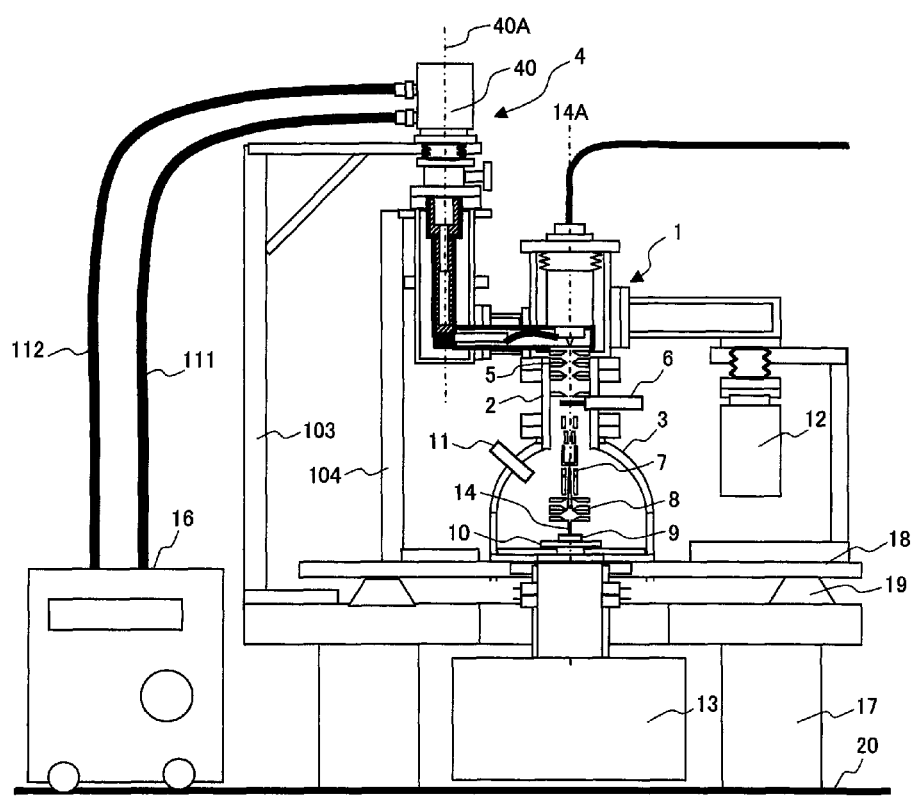
FIG. 1 is a schematic configuration view of a first example of an ion microscope according to the present invention.

DESCRIPTION OF SYMBOLS 1 gas field ion source
2 ion beam irradiation system column
3 sample chamber
4 cooling mechanism
5 condenser lens
6 beam limiting aperture
7 beam scanning electrode
8 objective lens
9 sample
10 sample stage
11 secondary particle detector
12 ion source vacuum exhaust pump
13 sample chamber vacuum exhaust pump
14 ion beam
14A optical axis
15 gas molecule ionization chamber
16 compressor
17 device mount
18 base plate
19 vibration proofing mechanism
20 floor
21 emitter tip
22 filament
23 filament mount
24 extraction electrode
25 gas supply piping
26 supporting rod
27 hole
28 side wall
29 top plate
30 resistive heater
31 opening
32 lid member
33 operation rod
34 lid member
40 refrigerator
40A center axis line
41 main body
42A, 42B stage
43 pot
46 helium gas
51 upper flange
52 sapphire base
53 cooling conduction rod
54 copper stranded wire
55 sapphire base
56 copper stranded wire
57 cooling conduction pipe
58 shield reducing the thermal radiation
59 electrostatic lens
60 electrode
61, 62 bellows
63 insulating material
64 emitter base mount
68 vacuum chamber
69 bellows
81 liquid or solid nitrogen chamber
82 liquid or solid nitrogen tank
83 vacuum exhaust port
84 solid nitrogen
85 supporting column
86 bellows
87 supporting column
91 gas field ion source control device
92 refrigerator control device
93 lens control device
94 beam limiting aperture control device
95 ion beam scanning control device
96 secondary electron detector control device
97 sample stage control device
98 vacuum exhaust pump control device
99 calculation processing device
101 surface plate
102 vibration free leg
103, 104 supporting column
133 electric wire
134 power supply
135 high voltage power supply
136 thin wire made of stainless steel
137 disconnecting mechanism
138 thick wire made of copper
139 thin wire made of stainless steel
140 disconnecting mechanism 141 ion extraction power supply
142 power supply
301 scanning deflection electrode
302 aperture plate
303 movable emission pattern observation mechanism
304 secondary particle
305 secondary particle detector
306 center line of ion irradiation system
307 ion image detector
308 mirror
400 compressor unit
401 GM refrigerator
402 heat exchanger
403 piping
404 transfer tube
405 heat exchanger
407 piping
408 first cooling stage
409 heat exchanger
410 heat exchanger
411 second cooling stage
412 heat exchanger
413 piping
414 heat exchanger
415 piping
416 vacuum heat insulating container
417, 418 supporting body
419 cover

BEST MODE FOR CARRYING OUT THE INVENTION

An example of an ion beam device according to the present invention will be described with reference to FIG. 1. A first example of a scanning ion microscope device will be hereinafter described as the ion beam device. The scanning ion microscope of the present example includes a gas field ion source 1, a column 2, a sample chamber 3, and a cooling mechanism 4. The inside of the column 2 and the sample chamber 3 is held in vacuum, and an ion beam irradiation system is arranged therein. The ion beam irradiation system includes an electrostatic condenser lens 5, a beam limiting aperture 6, a beam scanning electrode 7, and an electrostatic objective lens 8. A sample stage 10 for mounting a sample 9 and a secondary particle detector 11 are arranged in the sample chamber 3. An ion beam 14 from the gas field ion source 1 is irradiated onto the sample 9 through the ion beam irradiation system. The secondary particle beam from the sample 9 is detected by the secondary particle detector 11. Although not illustrated, an electron gun for neutralizing the charge up of the sample when the ion beam is irradiated, and a gas gun for supplying etching or deposition gas to the vicinity of the sample are arranged.

The cooling mechanism 4 includes a refrigerator 40 for cooling the gas field ion source 1. In the ion microscope of the present example, a center axis line 40A of the refrigerator 40 is arranged parallel to an optical axis 14A of the ion beam irradiation system.

The ion microscope of the present example further includes an ion source vacuum exhaust pump 12 for vacuum exhausting the gas field ion source 1, and a sample chamber vacuum exhaust pump 13 for vacuum exhausting the sample chamber 3.

A base plate 18 is arranged on a device mount 17 arranged on a floor 20 by way of a vibration proofing mechanism 19. The gas field ion source 1, the column 2, and the sample chamber 3 are supported by the base plate 18.

A supporting column 103 is arranged on the device mount 17. The refrigerator 40 is supported by the supporting column 103. The vibration of the refrigerator 40 is transmitted to the device mount 17 through the supporting column 103. However, the vibration of the refrigerator 40 is reduced by the vibration proofing mechanism 19 and transmitted to the base plate 18. Therefore, the vibration of the refrigerator 40 is barely transmitted to the gas field ion source 1, the ion beam irradiation system column 2, and the sample chamber 3 through the supporting column 103, whereby high resolution performance of the scanning ion beam microscope is realized.

A compressor unit (compressor) 16 having helium gas etc. as an operation gas is installed on the floor 20 to supply the helium gas of high pressure to a Gifford-McMahon (GM) refrigerator 40 through a piping 111. The coldness is generated when the helium gas of high pressure is periodically expanded inside the GM refrigerator, and the low pressure helium gas, which became low pressure by expansion, is collected by the compressor unit through a piping 112.

The vibration of the compressor unit (compressor) 16 is transmitted to the device mount 17 through the floor 20. A vibration proofing mechanism 19 is arranged between the device mount 17 and the base plate 18, so that the vibration of high frequency of the floor is less likely to be transmitted to the gas field ion source 1, the ion beam irradiation system column 2, the sample chamber (vacuum sample chamber) 3, and the like. Therefore, the vibration of the compressor unit (compressor) 16 is less likely to be transmitted to the gas field ion source 1, the ion beam irradiation system column 2, and the sample chamber 3 through the floor 20. The refrigerator 40 and the compressor 16 have been described here as causes for the vibration of the floor 20. However, the causes for the vibration of the floor 20 are not limited thereto.

The vibration proofing mechanism 19 may be configured by a vibration proofing rubber, spring, damper, or a combination thereof. The base plate 18 includes a supporting column 104. The lower part of the cooling mechanism 4 is supported by the supporting column 104, which will be hereinafter described with reference to FIG. 3.

In the present example, the vibration proofing mechanism 19 is arranged above the device mount 17, but the vibration proofing mechanism 19 may be arranged at the leg of the device mount 17 or may be arranged at both places simultaneously.

Figure 2:
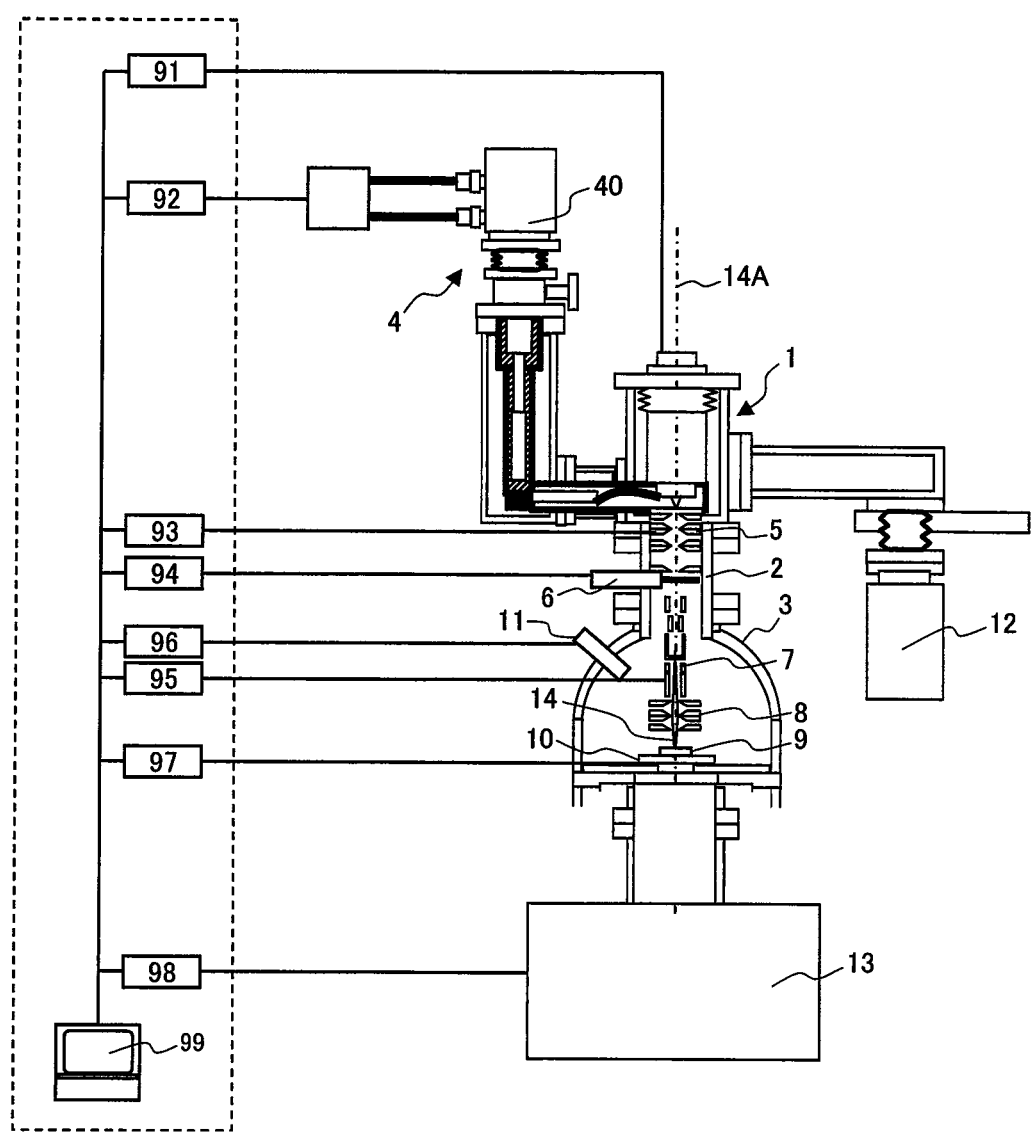
FIG. 2 is a schematic configuration view of a control system of a first example of the ion microscope according to the present invention.

FIG. 2 shows an example of a control device of an ion microscope according to the present invention shown in FIG. 1. The control device of the present example includes a gas field ion source control device 91 for controlling the gas field ion source 1, a refrigerator control device 92 for controlling the refrigerator 40, a lens control device 93 for controlling the condenser lens 5, a beam limiting aperture control device 94 for controlling the beam limiting aperture 6, an ion beam scanning control device 95 for controlling the beam scanning electrode 7, a secondary electron detector control device 96 for controlling the secondary particle detector 11, a sample stage control device 97 for controlling the sample stage 10, a vacuum exhaust pump control device 98 for controlling the sample chamber vacuum exhaust pump 13, and a calculation processing device 99 for performing various types of calculations. The calculation processing device 99 includes an image display unit. The image display unit displays images generated from a detection signal of the secondary particle detector 11, and information input by the input means.

The sample stage 10 includes a mechanism for linearly moving the sample 9 in two orthogonal directions within a sample mounting surface, a mechanism for linearly moving the sample 9 in a direction perpendicular to the sample mounting surface, and a mechanism for rotating the sample 9 within the sample mounting surface. The sample stage 10 further includes an inclination function capable of varying the irradiation angle of the ion beam 14 to the sample 9 by rotating the sample 9 about an inclination axis. Such controls are executed by the sample stage control device 97 according to a command from the calculation processing device 99.

The operation of the ion beam irradiation system of the ion microscope of the present example will now be described. The operation of the ion beam irradiation system is controlled by a command from the calculation processing device 99. The ion beam 14 generated by the gas field ion source 1 is converged by the condenser lens 5 with the beam diameter limited by the beam limiting aperture 6, and focused by the objective lens 8. The focused beam is irradiated on the sample 9 on the sample stage 10 while being scanned.

The secondary particles released from the sample are detected by the secondary particle detector 11. The signal from the secondary particle detector 11 is luminance-modulated and sent to the calculation processing device 99. The calculation processing device 99 generates a scanning ion microscope image and displays the same on the image display unit. The high resolution observation of the sample surface is thereby realized.

Figure 3:
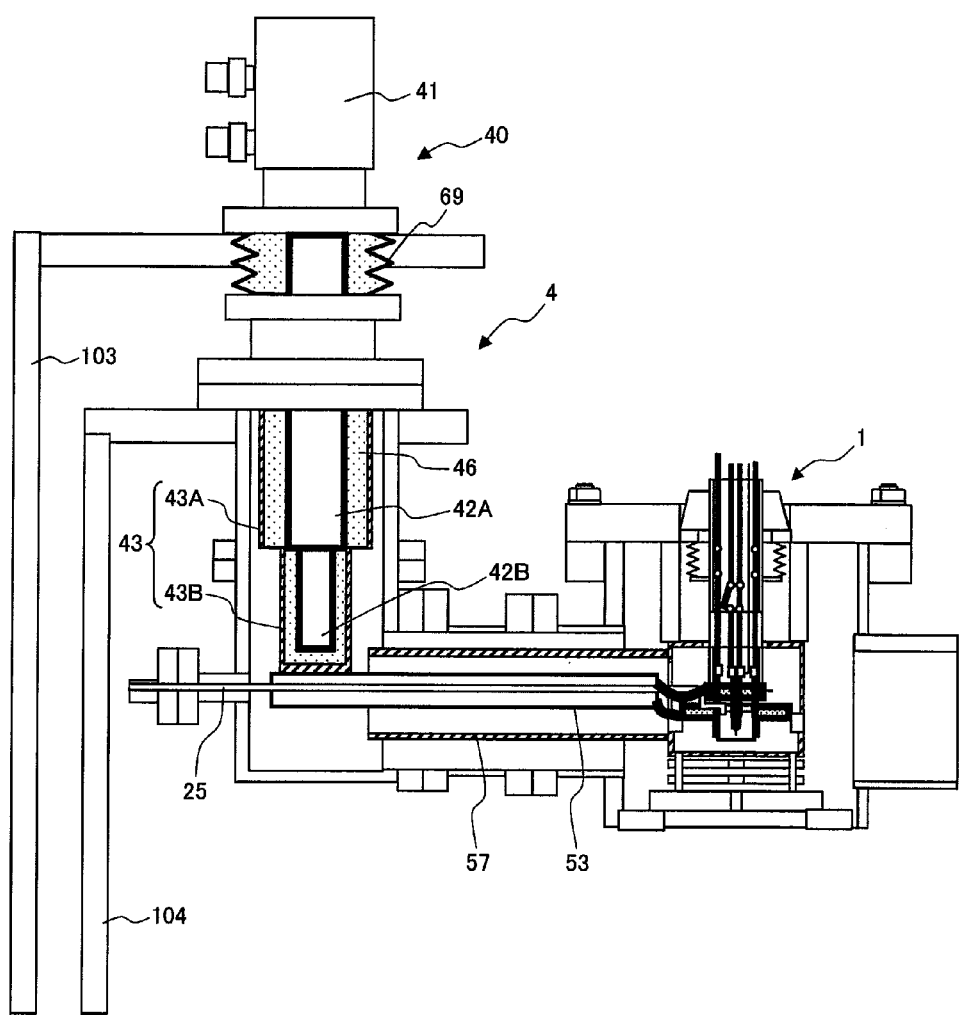
FIG. 3 is a schematic configuration view of a cooling mechanism of a gas field ion source of the first example of the ion microscope according to the present invention.

FIG. 3 shows an example of the configuration of the gas field ion source 1 and the cooling mechanism 4 thereof of the ion microscope according to the present invention shown in FIG. 1. The gas field ion source 1 will be described in detail in FIG. 4. The cooling mechanism 4 will be described here. In the present example, a cooling mechanism in which the GM refrigerator 40 and a helium gas pot 43 are combined is used for the cooling mechanism 4 of the gas field ion source 1. The center axis line of the GM refrigerator is arranged parallel to an optical axis of the ion beam irradiation system passing the emitter tip 21 of the ion microscope. Both the enhancement of the focusing property of the ion beam and the enhancement of the refrigerating function are thus realized.

The GM refrigerator 40 includes a main body 41, a first cooling stage 42A, and a second cooling stage 42B. The main body 41 is supported by the supporting column 103. The first cooling stage 42A and the second cooling stage 42B have a structure of being suspended from the main body 41.

The outer diameter of the first cooling stage 42A is greater than the outer diameter of the second cooling stage 42B. The refrigerating ability of the first cooling stage 42A is about 5 W, and the refrigerating ability of the second cooling stage 42B is about 0.2 W. The first cooling stage 42A is cooled up to about 50 K. The second cooling stage 42B can be cooled up to 4 K.

The upper end of the first cooling stage 42A is surrounded by a bellows 69. The lower end of the first cooling stage 42A and the second cooling stage 42B are covered by a gas tight pot 43. The pot 43 includes a portion 43A of large diameter configured to surround the first cooling stage 42A, and a portion 43B of small diameter configured to surround the second cooling stage 42B. The pot 43 is supported by the supporting column 104. As shown in FIG. 1, the supporting column 104 is supported by the base plate 18.

The bellows 69 and the pot 43 have a sealed structure, where helium gas 46 is filled therein as a thermal conductive medium. Two cooling stages 42A, 42B are surrounded by the helium gas 46, but are not contacted to the pot 43. Neon gas or hydrogen may be used in place of the helium gas.

In the GM refrigerator 40 of the present example, the first cooling stage 42A is cooled up to about 50 K. Thus, the helium gas 46 at the periphery of the first cooling stage 42A is cooled to about 70 K. The second cooling stage 42B is cooled to 4 K. The helium gas 46 at the periphery of the second cooling stage 42B is cooled to about 6 K. The lower end of the pot 43 is thereby cooled to about 6 K.

The vibration of the main body 41 of the GM refrigerator 40 is transmitted to the supporting column 103 and the two cooling stages 42A, 42B. The vibration transmitted to the cooling stages 42A, 42B is attenuated by the helium gas 46. Although the heat is conducted as the helium gas exists in the middle even if the cooling stages 42A, 42B of the GM refrigerator vibrate, the mechanical vibration is attenuated and the vibration is difficult to be propagated to the sealed pot 43 cooled by the first cooling stage 42A and the second cooling stage 42B. In particular, the vibration of high number of vibrations is less likely to be transmitted. In other words, an effect in which the mechanical vibration of the pot 43 is reduced extremely compared to the mechanical vibration of the cooling stages 42A, 42B of the GM refrigerator is obtained.

As described with reference to FIG. 1, the vibration of the compressor 16 is transmitted to the device mount 17 through the floor 20, but is prevented from being transmitted to the base plate 18 by the vibration proofing mechanism 19. Therefore, the vibration of the compressor 16 is not transmitted to the supporting column 104 and the pot 43.

The lower end of the pot 43 is connected to a cooling conduction rod 53 made of copper having high thermal conductivity. A gas supply piping 25 is arranged inside the cooling conduction rod 53. The cooling conduction rod 53 is covered by a cooling conduction pipe 57 made of copper.

In the present example, a shield reducing the thermal radiation (not shown) is connected to the portion 43A of large diameter of the pot 43, and in turn, the shield reducing the thermal radiation is connected to the cooling conduction pipe 57 made of copper. Therefore, the cooling conduction rod 53 and the cooling conduction pipe 57 are always held at the same temperature as the pot 43.

The GM refrigerator 40 is used in the present example, but instead, a pulse tube refrigerator or a sterling refrigerator may be used. Furthermore, the refrigerator includes two cooling stages in the present example, but may include a single cooling stage, and the number of cooling stages is not particularly limited.

An example of the configuration of the gas field ion source and its periphery of the ion microscope according to the present invention will be described in detail with reference to FIG. 4. The gas field ion source of the present example includes an emitter tip 21, an extraction electrode 24, and an electrostatic lens 59. The extraction electrode 24 includes a hole through which the ion beam passes. The electrostatic lens 59 includes three electrodes in the present example, each of which has a center hole. The emitter tip 21 is arranged facing the extraction electrode 24.

A scanning deflection electrode 301, an aperture plate 302, a shutter 303, a secondary particle detector 305, and an ion image detector 307 are arranged below the electrostatic lens 59. The ion beam passes along the center line 306 of the ion irradiation system.

The emitter tip 21 is suspended from an upper flange 51, where a supporting portion of the emitter tip 21 has a movable structure. The movable structure of the emitter tip 21 will be hereinafter described in detail with reference to FIG. 6A and FIG. 6B. The extraction electrode 24 is fixedly attached with respect to a vacuum chamber 68. The vacuum chamber 68 is an upper structure of the column shown in FIG. 1.

The emitter tip 21 is supported by a sapphire base 52. The sapphire base 52 is connected to the cooling conduction rod 53 by way of a copper stranded wire 54 (wire in which about 1000 copper wires having a diameter of 50 micrometers are intertwined). The extraction electrode 24 is supported by the sapphire base 55. The sapphire base 55 is connected to the cooling conduction rod 53 by way of a copper stranded wire 56. Therefore, the emitter tip 21, the sapphire base 52, the copper stranded wire 54, the cooling conduction rod 53, and the pot 43 compose a heat transmission path. Similarly, the extraction electrode 24, the sapphire base 55, the copper stranded wire 56, the cooling conduction rod 53, and the pot 43 compose a heat transmission path.

In other words, the present cooling mechanism includes a coldness generation means for generating coldness by expanding a first high pressure gas generated in the compressor unit, and a cooling mechanism for cooling the emitter tip 21 or a body to be cooled with a second gas, which is helium gas, in the pot 43 cooled by the coldness of the coldness generation means.

A shield reducing the thermal radiation 58 is arranged to surround the emitter tip 21 and the extraction electrode 24. The shield reducing the thermal radiation 58 reduces the heat flow-in by heat radiation to the extraction electrode 24 and the gas molecule ionization chamber. The shield reducing the thermal radiation 58 is connected to the cooling conduction pipe 57. An electrode 60 closest to the extraction electrode 24 of the three electrodes of the electrostatic lens 59 is connected to the shield reducing the thermal radiation 58. The electrode 60, the shield reducing the thermal radiation 58, the cooling conduction pipe 57, the shield reducing the thermal radiation, and the pot 43 compose a heat transmission path.

In the present example, the sapphire bases 52, 55 and the cooling conduction rod 53 are connected by deformable copper stranded wires 54, 56. The copper stranded wire 54 has a function of holding the heat transmission path including the emitter tip 21, the sapphire base 52, and the cooling conduction rod 53 even if the position of the emitter tip 21 is displaced. Furthermore, the copper stranded wire 54 having high flexibility prevents the high frequency vibration from being transmitted to the sapphire base 52 and the emitter tip 21 through the cooling conduction rod 53. The copper stranded wire 56 prevents the high frequency vibration from being transmitted to the sapphire base 55 and the extraction electrode 24 through the cooling conduction rod 53. The copper stranded wire 54, which is a heat transferring member, is not limited to copper member as long as it is a soft member having high thermal conductivity and is less likely to transmit vibration, and may be silver stranded wire.

Therefore, in the present example, effects such as the extremely low temperature of the emitter tip is realized, the gas field ion source in which the ion beam of greater current is obtained is provided, and the ion microscope enabling high resolution observation is provided are achieved.

In the gas field ion source of the present example, the extraction electrode is fixed with respect to the vacuum chamber, but the emitter tip is movable with respect to the extraction electrode. Thus, the position adjustment of the emitter tip with respect to the hole of the extraction electrode and the axis adjustment of the emitter tip with respect to the optical system can be carried out, and a microscopic ion beam can be formed.

The axis adjustment of the emitter tip will now be described. A shutter 302 is moved to decenter the hole formed in the shutter 302 from a center axis line 306 of the ion beam irradiation system. The ion beam 14 generated by the emitter tip 21 passes through the electrostatic lens 59, passes through the scanning deflection electrode 301, and further passes through the hole of the aperture plate 302 and hits the shutter 302. The secondary particles 304 such as the secondary electron are generated from the shutter 302. The secondary particles 304 are detected by the secondary particle detector 305 thereby obtaining a secondary particle image. The ion emission pattern of the emitter tip can be observed in the secondary particle image by arranging a microscopic projection at the upper part of the shutter 302. Alternatively, a microscopic hole may be formed, so that when the aperture plate 302 is mechanically moved and scanned in two directions perpendicular to the ion beam, the ion release pattern can be observed even by detecting the secondary particles of when the ion beam that passed the aperture plate 302 is irradiated on a different shutter plate. The position and the angle of the emitter tip are adjusted while observing the ion emission pattern in the above manner. The shutter 302 is moved after the axis adjustment of the emitter tip. The ion beam thereby passes through the hole of the shutter 302. A movable emission pattern observation mechanism 303 can also be used. In other words, the movable emission pattern observation mechanism 303 is moved to decenter the hole formed in the movable emission pattern observation mechanism 303 from the center axis line 306 of the ion beam irradiation system. An ion image detector 307 including a micro-channel plate and a fluorescent plate is arranged on the movable emission pattern observation mechanism 303. The image of the fluorescent plate can be observed with a mirror 308 arranged below the ion image detector 307. In other words, the emission direction and the emission pattern of the ion beam can be observed. After the observation is finished, the hole formed in the movable emission pattern observation mechanism 303 is returned to the center axis line 306 of the ion beam irradiation system to enable the ion beam to pass through.

The configuration of the gas field ion source of the ion microscope according to the present invention will be further described in detail with reference to FIG. 5. The gas field ion source of the present example includes the emitter tip 21, a pair of filaments 22, a filament mount 23, a supporting rod 26, and an emitter base mount 64. The emitter tip 21 is fixed to the filament 22. The filament 22 is fixed to the supporting rod 26. The supporting rod 26 is supported by the filament mount 23. The filament mount 23 is fixed to the emitter base mount 64. As shown in FIG. 4, the emitter base mount 64 is attached to the upper flange 51. The emitter base mount 64 and the shield reducing the thermal radiation 58 or the vacuum chamber 68 are connected by a bellows 61.

The gas field ion source of the present example also includes an extraction electrode 24, a cylindrical resistive heater 30, a cylindrical side wall 28, and a top plate 29. The extraction electrode 24 is arranged facing the emitter tip 21, and includes a hole 27 through which the ion beam 14 passes. The top plate 29 is connected with an insulating material 63. A bellows 62 is attached between the insulating material 63 and the filament mount 23.

The side wall 28 and the top plate 29 surround the emitter tip 21. A space surrounded by the extraction electrode 24, the side wall 28, the top plate 29, the bellows 62, the insulating material 63, and the filament mount 23 is called the gas molecule ionization chamber 15.

The gas supply piping 25 is connected to the gas molecule ionization chamber 15. The ion material gas (ionized gas) is supplied to the emitter tip 21 by the gas supply piping 25. The ion material gas (ionized gas) is helium or hydrogen.

The gas molecule ionization chamber 15 is sealed excluding the hole 27 of the extraction electrode 24 and the gas supply piping 25. The gas supplied into the gas molecule ionization chamber through the gas supply piping 25 does not leak from the region other than the hole 27 of the extraction electrode 27 and the gas supply piping 25. The interior of the gas molecule ionization chamber can be held at high air tightness and sealability by having the diameter of the hole 27 of the extraction electrode 24 sufficiently small. The diameter of the hole 27 of the extraction electrode 24 is smaller than or equal to 0.2 mm. Thus, when the ionized gas is supplied to the gas ionization chamber 15 from the gas supply tube 25, the gas pressure of the gas ionization chamber 15 becomes greater than the gas pressure of the vacuum chamber by at least one figure. The proportion of the ion beam which collides with the gas in vacuum to be neutralized is thus reduced, and the ion beam of large current can be generated.

The resistive heater 30 is used to perform degassing process on the extraction electrode 24, the side wall 28, and the like. The extraction electrode 24, the side wall 28, and the like are degassed by heating. The resistive heater 30 is arranged on the outer side of the gas molecule ionization chamber 15. Therefore, even if the resistive heater itself is degasified, this is carried out outside the gas molecule ionization chamber, and hence the interior of the gas molecule ionization chamber is at high vacuum.

In the present example, the resistive heater is used for the degassing process, but instead, the heating lamp may be used. The heating lamp can simplify the peripheral structure of the extraction electrode as it can heat the extraction electrode 24 in a non-contact manner. Furthermore, since high voltage does not need to be applied in the heating lamp, the structure of the heating lamp power supply is simple. Furthermore, instead of using the resistive heater, inactive gas of high temperature may be supplied through the gas supply piping 25 to heat the extraction electrode, the side wall, and the like and perform the degassing process. In such a case, the gas heating mechanism can be at ground potential. Furthermore, the peripheral structure of the extraction electrode becomes simple, and wirings and power supplies are unnecessary.

The sample chamber 3 and the sample chamber vacuum exhaust pump 13 are heated up to about 200° C. by the resistive heater attached to the sample chamber 3 and the sample chamber vacuum exhaust pump 13 so that the degree of vacuum of the sample chamber 3 is smaller than or equal to $10^{-7}$ Pa at maximum. Thus, contamination is avoided from attaching to the surface of the sample when the sample is irradiated with the ion beam, and the surface of the sample can be satisfactorily observed. In the prior art, the observation of the sample surface was difficult as the growth of deposition by contamination is fast when the surface of the sample is irradiated with a beam of helium ion or hydrogen ion. The sample chamber 3 and the sample chamber vacuum exhaust pump 13 are thus heating processed in the vacuum state to have the residual gas of hydrocarbon system in vacuum of the sample chamber 3 to a microscopic amount. The outermost surface of the sample then can be observed at high resolution.

The operation of the gas field ion source of the present example will now be described. The inside of the vacuum chamber is vacuum exhausted by the ion source vacuum exhaust pump 12. The degassing process of the extraction electrode 24, the side wall 28, and the top plate 29 is carried out by the resistive heater 30. In other words, the extraction electrode 24, the side wall 28, and the top plate 29 are degassed by heating. Another resistive heater may be arranged on the outer side of the vacuum chamber to heat the vacuum chamber. The degree of vacuum in the vacuum chamber thereby increases and the concentration of the residual gas lowers. The time stability of the ion release current can be enhanced by such operation.

After the degassing process is finished, the heating by the resistive heater 30 is stopped and the refrigerator is operated after elapse of a sufficient time. The emitter tip 21, the extraction electrode 24, the shield reducing the thermal radiation 58, and the like are thereby cooled. The ionized gas is then introduced into the gas molecule ionization chamber 15 by the gas supply piping 25. The ionized gas is helium or hydrogen, where description will be made herein with helium. As described above, the interior of the gas molecule ionization chamber has high degree of vacuum. Therefore, the proportion of the ion beam generated by the emitter tip 21 which collides with the residual gas in the gas molecule ionization chamber to be neutralized is reduced. Thus, the ion beam of large current can be generated. The number of the helium gas molecules of high temperature which collides with the extraction electrode is also reduced. The cooling temperature of the emitter tip and the extraction electrode thus can be lowered. Therefore, the sample can be irradiated with the ion beam of large current.

The voltage is then applied between the emitter tip 21 and the extraction electrode 24. An intense electric field is formed at the distal end of the emitter tip. Most of the helium supplied from the gas supply piping 25 is pulled to the emitter tip surface by the strong electric field. The helium reaches the vicinity of the distal end of the emitter tip where the electric field is the strongest. The helium is then field-ionized and the helium ion beam is generated. The helium ion beam is guided to the ion beam irradiation system through the hole 27 of the extraction electrode 24.

The structure and the manufacturing method of the emitter tip 21 will now be described. First, a tungsten wire having a diameter of about 100 to 400 μm and an axial direction of <111> is prepared and the distal end thereof is molded sharp. The emitter tip having a distal end with a curvature radius of few 10 nm is thereby obtained. Platinum is then vacuum deposited to the distal end of the emitter tip in a different vacuum chamber. The platinum atoms are moved to the distal end of the emitter tip under high temperature heating. A pyramid structure of nanometer order is thereby formed by the platinum atoms. This is called a nano-pyramid. The nano-pyramid typically has one atom at the distal end, a layer of three or six atoms thereunder, and a layer of ten or more atoms further thereunder.

In the present example, a thin wire of tungsten is used, but a thin wire of molybdenum may be used. The covering of platinum is used in the present example, but a covering of iridium, rhenium, osmium, palladium, rhodium, and the like may be used.

When using helium for the ionized gas, it is important that the evaporation intensity of the metal is greater than the electric field intensity at which the helium ionizes. Therefore, the coverage of platinum, rhenium, osmium, and iridium is suitable. When using hydrogen for the ionized gas, the coverage of platinum, rhenium, osmium, palladium, rhodium, and iridium is suitable. The formation of the coverage of such metals may be carried out through vacuum deposition method but may also be carried out by plating in a solution.

Other methods of forming the nano-pyramid at the distal end of the emitter tip include field evaporation in vacuum, ion beam irradiation, and the like. The tungsten atom or the molybdenum atom nano-pyramid can be formed at the distal end of the tungsten wire or the molybdenum wire by such method. For instance, if the tungsten wire of <111> is used, the distal end has a characteristic of being configured with three tungsten atoms.

As described above, the characteristic of the emitter tip 21 of the gas field ion source according to the present invention is the nano-pyramid. The helium ion can be generated in the vicinity of one atom at the distal end of the emitter tip by adjusting the electric field intensity formed at the distal end of the emitter tip 21. Therefore, the region where the ion is released, that is, the ion light source is a very narrow region of smaller than or equal to a nanometer. Therefore, the beam diameter can be made to smaller than or equal to 1 nm by generating the ion from a very limited region. The current value per unit area and unit solid angle of the ion source thus becomes large. This is an important property in obtaining the ion beam of microscopic diameter and large current on the sample.

In particular, when platinum is vapor deposited on the tungsten, the nano-pyramid structure in which one atom exists at the distal end is stably formed. In this case, the helium ion generation area is concentrated at the vicinity of the one atom at the distal end. If three atoms exist at the distal end of the tungsten <111>, the helium ion generation area is dispersed at the vicinity of three atoms. Therefore, the current released from the unit area or the unit solid angle becomes greater in the ion source having a nano-pyramid structure of platinum in which the helium gas is supplied in a concentrated manner to one atom. In other words, the emitter tip in which platinum is vapor deposited on the tungsten is suitable in reducing the beam diameter on the sample of the ion microscope or in increasing the current. When the nano-pyramid having one atom at the distal end is formed using rhenium, osmium, iridium, palladium, rhodium, and the like, the current released from the unit area or the unit solid angle can be similarly increased, the beam diameter on the sample of the ion microscope can be reduced, and the current can be increased.

As described above, the position and the angle of the emitter tip are adjusted while observing the ion emission pattern in the observation method of the ion emission pattern, but the ion extraction voltage may be adjusted and then the ion beam trajectory or the aperture position may be adjusted so that the ion beam passes through the aperture after the ion emission pattern becomes one from one atom of the tip.

The characteristic of the ion source herein is that the ion released from the vicinity of one atom at the distal end of the nano-pyramid is used. In other words, the region the ion is released is narrow, and the ion light source is small or smaller than or equal to nanometer. Thus, the properties of the ion source can be exhibited to a maximum extent if the ion light source is focused on the sample at the same magnification or the reduction rate is increased to about one half. In the conventional gallium liquid metal ion source, the dimension of the ion light source is estimated to be about 50 nm. Therefore, the reduction rate needs to be smaller than or equal to $\frac{1}{10}$ in order to realize the beam diameter of 5 nm on the sample. In this case, the vibration of the emitter tip of the ion source is reduced to smaller than or equal to one tenth on the sample. For instance, even if the emitter tip is vibrating by 10 nm, the vibration of the beam spot on the sample is smaller than or equal to 1 nm. Therefore, the influence of the vibration of the emitter tip with respect to the beam diameter of 5 nm is very small. In the present example, the reduction rate is small and is about 1 to ½. Therefore, the vibration of 10 nm at the emitter tip becomes the vibration of 5 nm on the sample, whereby the vibration of the sample with respect to the beam diameter is large.

According to the present invention, the vibration proofing mechanism is arranged, as shown in FIG. 1. In other words, the vibration of the refrigerator 40 and the compressor 16 is less likely to be transmitted to the gas field ion source 1, the ion beam irradiation system column 2, and the sample chamber 3 by the vibration proofing mechanism 19. The vibration of the compressor 16 is less likely to be transmitted to the pot 43 and the sample stage 10. Therefore, according to the present invention, a high resolution observation of the sample surface can be realized by generating an ion beam of small diameter. Furthermore, since the proportion the ion beam collides with the gas in vacuum and neutralizes is small as the air tightness of the gas molecule ionization chamber is high in the ion source and the degree of vacuum is high on the outer side of the gas molecule ionization chamber, an effect in that the sample can be irradiated with an ion beam of large current can be obtained. The effects in that the number the helium gas molecule of high temperature collides with the extraction electrode reduces, the cooling temperature of the emitter tip and the extraction electrode can be lowered, and the sample can be irradiated with the ion beam of large current are obtained.

The distance between the distal end of the objective lens 8 and the surface of the sample 9 is referred to as a work distance. In the present ion beam device, the resolution becomes smaller than 0.5 mm if the work distance is smaller than 2 mm thereby realizing super-resolution. In the prior art, there was a possibility of inhibiting the normal operation when the sputter particles from the sample contaminate the objective lens since ions such as gallium was used. Such possibility is low and super-high resolution is realized in the ion microscope according to the present invention.

If the nano-pyramid is damaged by unpredicted discharge phenomenon and the like, the emitter tip is heated for about 30 minutes (about 1000° C.). The nano-pyramid then can be reproduced. In other words, the emitter tip can be easily repaired. A practical ion microscope thus can be realized.

Figure 6A:
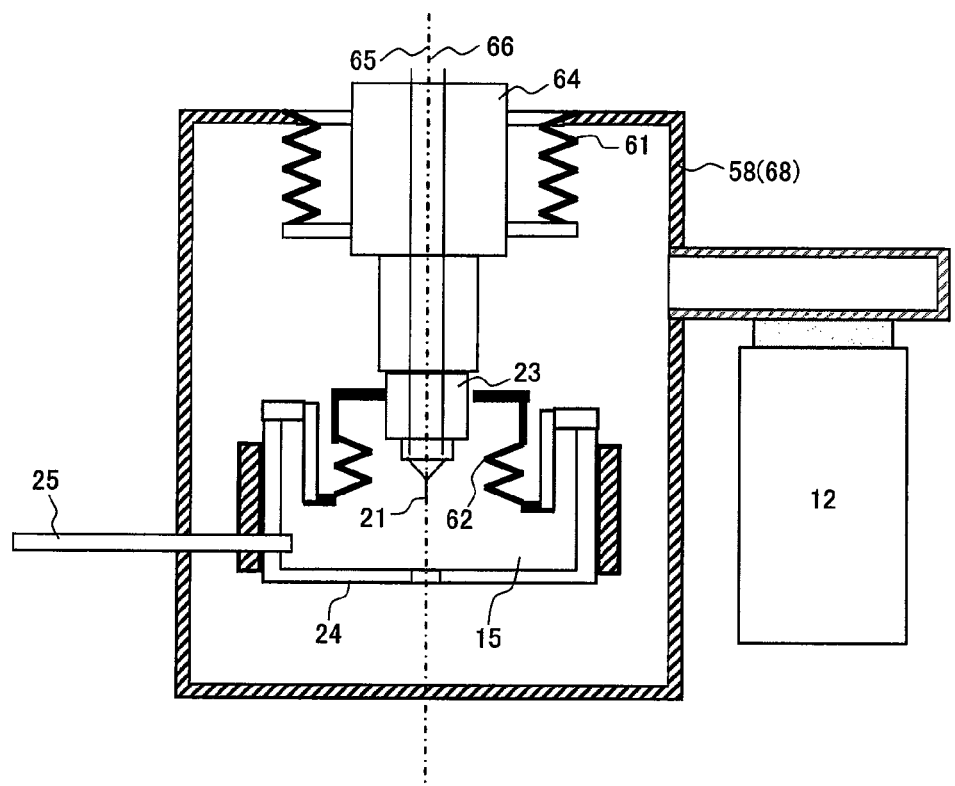
FIG. 6A is a schematic view of the periphery of an emitter tip before the inclination of the emitter tip of the gas field ion source of the first example of the ion microscope according to the present invention.
Figure 6B:
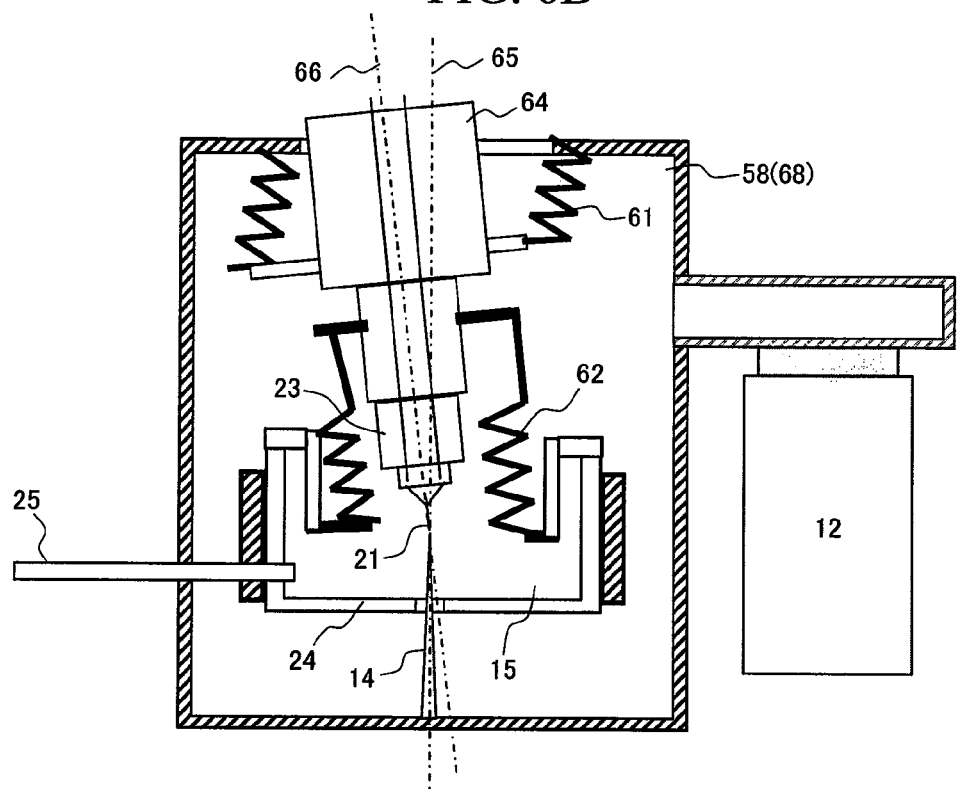
FIG. 6B is a schematic view of the periphery of the emitter tip after the inclination of the emitter tip of the gas field ion source of the first example of the ion microscope according to the present invention.

An inclination structure of the emitter tip of the gas field ion source of the present invention will be described with reference to FIG. 6A and FIG. 6B. The filament mount 23 is fixed to the emitter base mount 64, so that they both integrally displace. The gas ionization chamber barely contacts the vacuum chamber. The extremely low temperature of the ionization chamber is thus realized. The walls surrounding the ionization chamber at least should barely contact the vacuum chamber. The center axis line 66 passing the emitter tip 21 and the emitter base mount 64 can be inclined with respect to a vertical line 65, that is, the center axis line of the gas molecule ionization chamber 15. FIG. 6A shows a state in which the center axis line 66 passing the filament mount 23 and the emitter base mount 64 is not inclined with respect to the vertical line 65 (two lines overlap in the figure). FIG. 6B shows a state in which the center axis line 66 passing the filament mount 23 and the emitter base mount 64 is inclined with respect to the vertical line 65.

In the present example, the position of the emitter tip 21 is constant even if the center axis line passing the filament mount 23 and the emitter base mount 64 is inclined. In other words, the center axis line 66 passing the filament mount 23 and the emitter base mount 64 pivots on the emitter tip 21 as a center axis. Therefore, the emitter tip 21 rotates but does not displace in the transverse direction. The ion beam generated at the distal end of the emitter tip 21 passes through the hole 27 of the extraction electrode 24 even if the center axis line passing the filament mount 23 and the emitter base mount 64 is inclined. The center axis line of the extraction electrode overlaps or is parallel to the vertical line 65, that is, the center axis line of the ion irradiation system. Therefore, the electric field between the extraction electrode and the lens does not distort, and the focusing property of the ion beam enhances.

When the center axis line passing the filament mount 23 and the emitter base mount 64 does not pivot on the emitter tip 21 as a center axis, the emitter base mount 64 is to be moved within the XY plane after the inclination of the emitter tip 21.

The characteristic of the present structure lies in that the emitter tip 21 is connected to the extraction electrode 24 through the deformable bellows 62 and the insulating material 63. Thus, with the extraction electrode as a fixed structure, the emitter tip 21 is movable and can be inclined at the same time, and the helium does not leak other than to the small hole 27 of the extraction electrode and the gas supply piping 25 while surrounding the periphery of the emitter tip. This is the result of connecting the emitter tip 21 and the extraction electrode 24 with the deformable bellows 62 in between, and an effect of enhancing the air tightness of the gas molecule ionization chamber is obtained. A metal bellows is used in the present example, but similar effect is obtained even by connecting with a deformable material such as rubber. The characteristic also lies in that the ionization chamber in which the emitter tip is substantially surrounded by the emitter base mount, the shape varying mechanism component, the extraction electrode, and the like is deformable in the vacuum chamber. The characteristic also lies in that the ionization chamber substantially does not contact the vacuum chamber of room temperature. Thus, the focusing property of the ion beam enhances, the sealability of the gas molecule ionization chamber enhances, and the high gas pressure of the gas molecule ionization chamber can be realized.

When the center axis line passing the filament mount 23 and the emitter base mount 64 is inclined, the displacement amount of the emitter base mount 64 is greater than the displacement amount of the filament mount 23. The diameter of the bellows 61 connected to the emitter base mount 64 is greater than the diameter of the bellows 62 connected to the filament mount 23. Therefore, the bellows 61 is deformable so as to be able to absorb the displacement of the emitter base mount 64. The bellows 62 is deformable so as to be able to absorb the displacement of the filament mount 23.

According to the gas field ion source of the present invention, the vibration from the cooling mechanism is less likely to be transmitted to the emitter tip thereby enabling high resolution observation.

Furthermore, according to the gas field ion source of the present invention, the sealability of the gas molecule ionization enhances and the high gas pressure of the gas molecule ionization chamber can be realized by making the hole 27 of the extraction electrode 24 sufficiently small. Thus, the ion of large current can be released.

According to the gas field ion source of the present invention, the emitter can be made to an extremely low temperature since the heat transmission path from the cooling mechanism 4 to the emitter tip 21 is arranged. Thus, the ion beam of large current is obtained. Furthermore, according to the gas field ion source of the present invention, the axis adjustment of the emitter tip can be facilitated and larger current of the ion can be realized by having the extraction electrode as a fixed structure and the emitter tip as a movable structure, and connecting the emitter tip and the extraction electrode with a deformable raw material in between.

A second example of the ion microscope according to the present invention will be described with reference to FIG. 7. Comparing the ion microscope of the present example with the first example shown in FIG. 1, a vibration free leg 102 is arranged in place of the device mount 17 and the vibration proofing mechanism 19, and a surface plate 101 is arranged in place of the base plate 18 in the ion microscope of the present example. The surface plate 101 is formed by cast metal or stone material. The vibration free leg 102 may be configured by a vibration proofing rubber, a spring, a damper, or a combination thereof.

The gas field ion source 1, the column 2, and the sample chamber 3 are supported by the surface plate 101.

In the present example, a cooling mechanism in which the pulse tube refrigerator 40 and the helium gas pot 43 are combined is used for the cooling mechanism 4 of the gas field ion source 1. The center axis line of the pulse type refrigerator is arranged parallel to the optical axis 14A of the ion beam irradiation system passing the emitter tip 21 of the ion microscope. Both the enhancement of the focusing property of the ion beam and the enhancement of the refrigerating function are thus realized.

Figure 4:
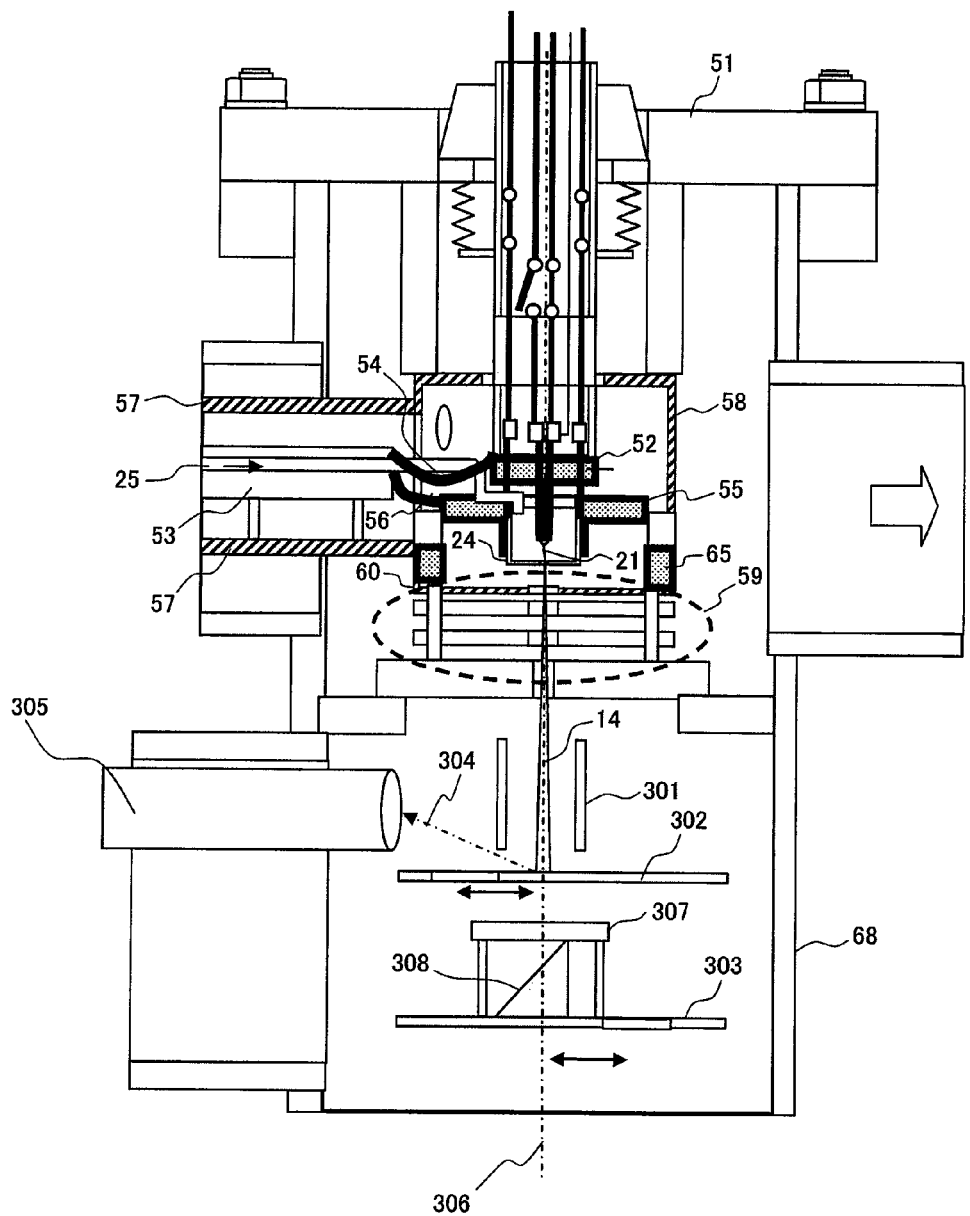
FIG. 4 is a schematic configuration view of the gas field ion source of the first example of the ion microscope according to the present invention.
Figure 5:
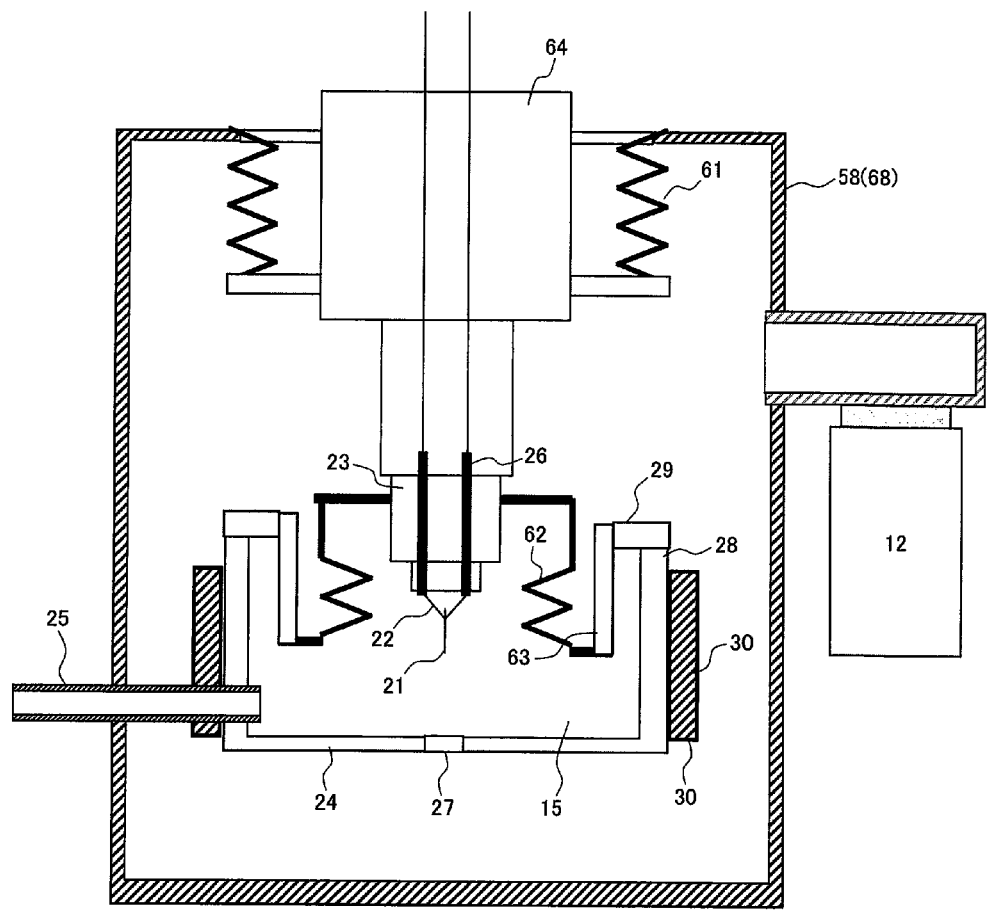
FIG. 5 is a schematic configuration view of a gas molecule ionization chamber of the gas field ion source of the first example of the ion microscope according to the present invention.

Similar to the cooling mechanism shown in FIG. 3 and FIG. 4, the emitter tip 21, the sapphire base 52, the copper stranded wire 54, the cooling conduction rod 53, and the pot 43 compose the heat transmission path in the present example as well. Similarly, the extraction electrode 24, the sapphire base 55, the copper stranded wire 56, the cooling conduction rod 53, and the pot 43 compose the heat transmission path. The copper stranded wire 54, which is a heat transferring member, is not limited to copper member as long as it is a soft member having high thermal conductivity and is less likely to transmit vibration, and may be silver stranded wire.

The cooling stage of the refrigerator is covered by the sealing-type pot 43. The cooling stage contacts the helium gas of the thermal conductor accommodated in the helium gas pot 43 but is distant from the helium gas pot 43. The vibration from the main body of the pulse type refrigerator is not transmitted to the helium gas pot 43 through the cooling stage.

The supporting column 103 is supported by the floor 20. The refrigerator 40 is supported by the supporting column 103. The vibration of the refrigerator 40 is transmitted to the floor 20 through the supporting column 103. However, the vibration of the refrigerator 40 is barely transmitted from the floor 20 to the surface plate 101 by the vibration free leg 102. Therefore, the vibration of the refrigerator 40 is barely transmitted to the gas field ion source 1, the ion beam irradiation system column 2, and the sample chamber 3 through the floor 20 thereby enabling the high resolution observation by the ion beam microscope.

The vibration of the compressor 16 is transmitted to the floor 20. However, the vibration of the compressor 16 is barely transmitted from the floor 20 to the surface plate 101 by the vibration free leg 102. Therefore, the vibration of the compressor 16 is barely transmitted to the gas field ion source 1, the ion beam irradiation system column 2, and the sample chamber 3 through the floor 20 thereby enabling the high resolution observation by the ion beam microscope.

The supporting column 104 is arranged on the surface plate 101. Similar to the cooling mechanism shown in FIG. 3, the helium gas pot 43 is supported by the supporting column 104 in the present example as well. The vibration free leg 102 is arranged between the surface plate 101 and the floor 20. Thus, the vibration of the refrigerator 40 and the compressor 16 is barely transmitted to the helium gas pot 43 through the supporting column 104.

The pulse type refrigerator does not include a mechanical drive unit near the cooling stage. Therefore, the vibration generated by the cooling mechanism of the present example is small. The conventional gas field ion source and the ion microscope have a problem in that the resolution of the observation degrades by the vibration of the refrigerator. In the ion microscope of the present example, however, reduction in the mechanical vibration can be achieved. This allows high resolution observation.

In the first example and the second example described above, the mechanical refrigerator is used for the cooling mechanism 4 of the gas field ion source 1. However, the mechanical refrigerator essentially generates mechanical vibration, which may be transmitted to the emitter tip or the sample stage. In the ion microscope, the vibration of the emitter tip vibrates the irradiation point on the sample of the beam thereby degrading the microscope resolution. In the following example, the mechanical refrigerator is not used for the cooling mechanism 4.

A third example of the ion microscope according to the present invention will be described with reference to FIG. 8. Comparing the ion microscope of the present example with the first example shown in FIG. 1, the configuration of the cooling mechanism 4 for the gas field ion source 1 is different. The cooling mechanism 4 will be described here. The cooling mechanism 4 of the present example includes a vacuum chamber 81 and a cooling tank 82. The vacuum chamber 81 is configured by the vacuum chamber, and the cooling tank 82 is accommodated therein. The vacuum chamber 81 and the cooling tank 82 do not contact. Therefore, the vibration and the heat are barely transmitted between the vacuum chamber 81 and the cooling tank 82.

The cooling tank 82 includes a vacuum exhaust port 83. The vacuum exhaust port 83 is connected to a vacuum pump (not shown). A cooling conduction rod 53 made of copper similar to the first example shown in FIG. 3 is connected to the cooling tank 82. Similar to the cooling mechanism shown in FIG. 3 and FIG. 4, the emitter tip 21, the sapphire base 52, the copper stranded wire 54, the cooling conduction rod 53, and the cooling tank 82 compose the heat transmission path in the present example as well. Similarly, the extraction electrode 24, the sapphire base 55, the copper stranded wire 56, the cooling conduction rod 53, and the cooling tank compose the heat transmission path. The copper stranded wire 54, which is a heat transferring member, is not limited to copper member as long as it is a soft member having high thermal conductivity and is less likely to transmit vibration, and may be silver stranded wire.

First, liquid nitrogen is introduced into the cooling tank 82, and the interior of the cooling tank is vacuum exhausted through the vacuum exhaust port 83. The temperature of the liquid nitrogen thereby lowers. The liquid nitrogen solidifies and becomes solid nitrogen 84. The solidifying temperature in vacuum of the liquid nitrogen is about 51 K.

In the present example, after the liquid nitrogen is completely solidified, the vacuum pump connected to the vacuum exhaust port 83 is stopped and the ion beam is generated by the emitter tip 21. The mechanical vibration of the vacuum pump is not generated when the vacuum pump is stopped. Thus, the ion emitter does not vibrate.

Heat is transmitted through the emitter tip 21 and the heat transmission path between the extraction electrode 24 and the cooling tank 82 during the generation of the ion beam. The solid nitrogen in the cooling tank 82 thus sublimates or melts. In the present example, latent heat such as sublimation heat and melting heat of the solid nitrogen can be used to cool the emitter tip 21 and the extraction electrode 24.

The vacuum pump connected to the vacuum exhaust port 83 is operated to vacuum exhaust the interior of the cooling tank 82 before all of the solid nitrogen starts to liquefy and boil. The temperature of the liquid nitrogen thus lowers and the liquid nitrogen solidifies. After all the liquid nitrogen solidifies, the vacuum pump connected to the vacuum exhaust port 83 is again stopped. This is repeated so that the temperature of the nitrogen in the cooling tank 82 can be constantly maintained around the melting point of the nitrogen. The temperature of the nitrogen in the cooling tank 82 is always a lower temperature than the boiling point. Therefore, the vibration caused by the boiling of the liquid nitrogen does not occur. The cooling mechanism of the present example thus does not generate the mechanical vibration. This allows high resolution observation.

In the present example, the temperature of the nitrogen in the cooling tank 82 is measured to control the operation of the vacuum pump connected to the vacuum exhaust port 83. For instance, the operation of the vacuum pump connected to the vacuum exhaust port 83 is started when the temperature of the nitrogen reaches a predetermined temperature higher than the melting point. The operation of the vacuum pump connected to the vacuum exhaust port 83 is stopped when the temperature of the nitrogen reaches a predetermined temperature lower than the melting point. The degree of vacuum may be measured instead of the temperature of the nitrogen in the cooling tank 82 to control the operation of the vacuum pump connected to the vacuum exhaust port 83.

In the present example, the liquid nitrogen in the cooling tank 82 is cooled by vacuum exhausting the interior of the cooling tank 82. However, this causes the nitrogen of gas phase to be exhausted and the nitrogen reduces with time. The solid nitrogen in the cooling tank 82 may be cooled using the refrigerator. The reduction of nitrogen then can be prevented. The generation of the ion beam by the gas field ion source 1 is preferably stopped during the operation of the refrigerator. In other words, according to the ion source of the present example, an ion microscope in which the reduction in the mechanical vibration is realized and high resolution observation can be carried out is proposed.

The base plate 18 is arranged on the device mount 17 arranged on the floor 20 by way of the vibration proofing mechanism 19. The gas field ion source 1, the column 2, and the sample chamber 3 are supported by the base plate 18.

The supporting column 85 is arranged on the device mount 17. The vacuum exhaust port 83 of the cooling tank 82 is supported by the supporting column 85. The supporting column 85 and the vacuum chamber 81 are connected by the bellows 86. The supporting column 87 is arranged on the base plate 18. The vacuum chamber 81 is supported by the supporting column 87, and at the same time, is suspended by the supporting column 85 through the bellows 86.

The bellows 86 reduces the transmission of high frequency vibration. Therefore, the vibration from the floor 20 is reduced by the bellows even if transmitted to the supporting column 85 through the device mount 17. Therefore, the vibration from the floor 20 is barely transmitted to the vacuum chamber 81 through the supporting column 85. The vibration from the floor 20 is transmitted to the device mount 17. However, the vibration from the floor 20 is barely transmitted to the base plate 18 by the vibration proofing mechanism 19. Therefore, the vibration from the floor 20 is barely transmitted to the vacuum chamber 81 through the supporting column 87.

Therefore, according to the present example, the vibration from the floor 20 is not transmitted to the vacuum chamber 81 and the cooling tank 82. The vibration from the floor 20 is thus not transmitted to the gas field ion source 1, the ion beam irradiation system column 2, and the sample chamber 3 through the cooling mechanism 4.

In the prior art, an example that takes into consideration the vibration of the tank for accommodating the liquid nitrogen is known. However, sufficient review is not made on the transmission of the vibration of the tank to the vacuum chamber thereby affecting the ion beam. According to the present invention, the vibration of the cooling tank 82 is less likely to be transmitted to the vacuum chamber 81. The ion beam microscope of high resolution is provided since the vibration from the floor 20 through the vacuum chamber 81 and the cooling tank 82 is reduced.

The nitrogen is filled in the cooling tank 82 in the present example, but neon, oxygen, argon, methane, hydrogen and the like may be used other than nitrogen. In particular, if solid neon is used, a low temperature suitable for obtaining larger current of the helium or the hydrogen ion beam can be achieved.

Figure 9:
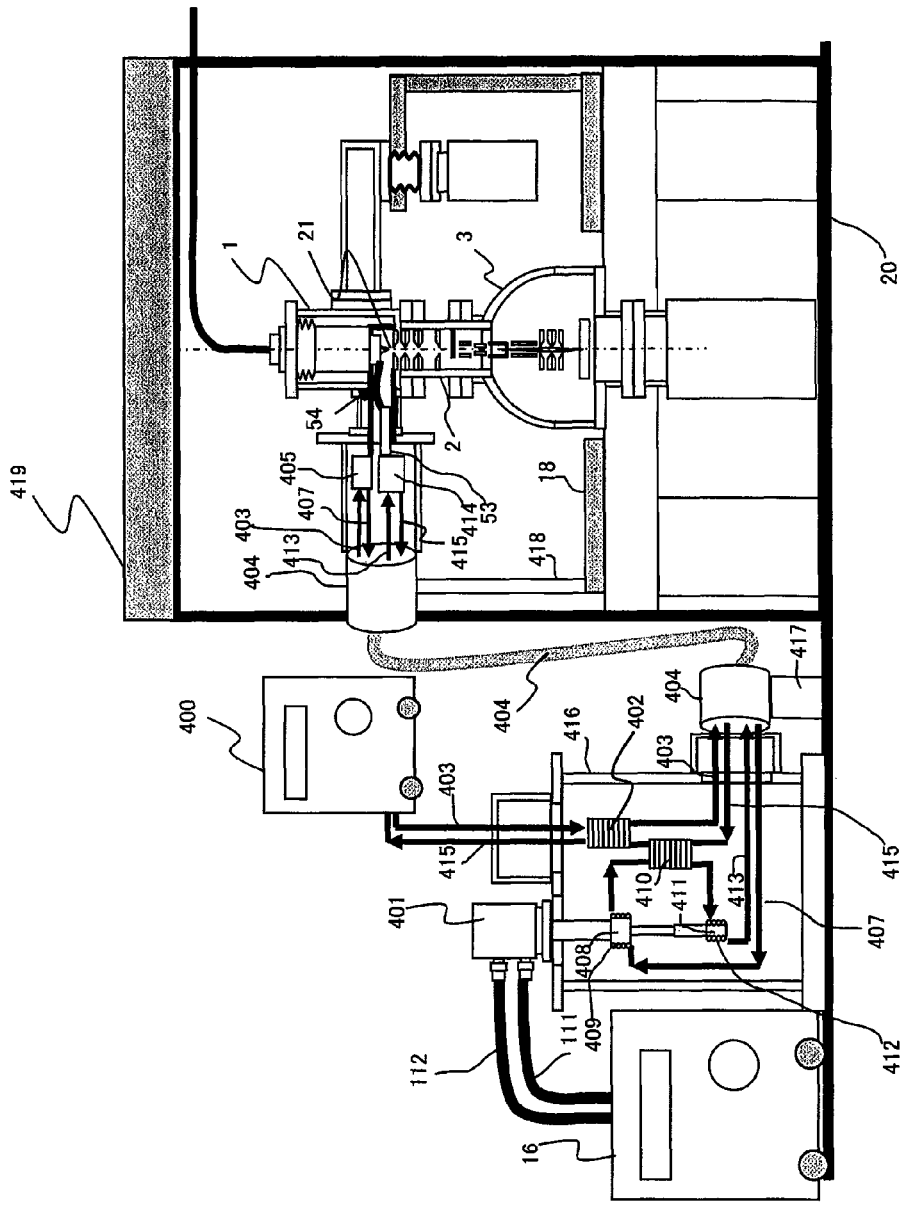
FIG. 9 is a schematic configuration view of a fourth example of the ion microscope according to the present invention.

A fourth example of the ion microscope according to the present invention will be described with reference to FIG. 9. Comparing the ion microscope of the present example with the first example shown in FIG. 1, the configuration of the cooling mechanism 4 for the gas field ion source 1 is different. The cooling mechanism 4 will be described here. The cooling mechanism 4 of the present example is a helium circulating type.

The cooling mechanism 4 of the present example cools the helium gas, which is a cooling medium, using a GM refrigerator 401 and heat exchangers 402, 405, 409, 410, 412, 414, and circulates the same with a compressor unit 400. The helium gas having a temperature of 300 K at normal temperature of 0.9 Mpa pressurized with the compressor unit (compressor) 400 flows into the heat exchanger 402 through a piping 403, and exchanges heat with the returning helium gas of low temperature, to be described later, to be cooled to a temperature of about 60 K. The cooled helium gas is transferred through the piping 403 of a heat insulated transfer tube 404, and then flows into the heat exchanger 405 arranged near the gas field ion source 1. The thermal conductor thermally integrated to the heat exchanger 405 is cooled to the temperature of about 65 K to cool the shield reducing the thermal radiation, and the like described above. The warmed helium gas flows out from the heat exchanger 405 and flows into the heat exchanger 409 thermally integrated to the first cooling stage 408 of the GM refrigerator 401 through a piping 407. The helium gas is then cooled to the temperature of about 50 K and flows into the heat exchanger 410. The helium gas then exchanges heat with the returning helium gas of low temperature to be described later to be cooled to the temperature of about 15 K, and thereafter, flows into the heat exchanger 412 thermally integrated to the second cooling stage 411 of the GM refrigerator 401. The helium gas is then cooled to the temperature of about 9 K, transferred through the piping 413 of the transfer tube 404, and flows into the heat exchanger 414 arranged near the gas field ion source 1. The helium gas cools the cooling conduction rod 53 of satisfactory thermal conductor thermally connected to the heat exchanger 414 to the temperature of about 10 K. The helium gas warmed by the heat exchanger 414 sequentially flows into the heat exchangers 410, 402 through the piping 415. The helium gas then exchanges heat with the helium gas described above and becomes substantially a normal temperature or a temperature of about 275 K. The helium gas is collected by the compressor unit 400 through the piping 415. The low temperature portion is accommodated in a vacuum heat insulating container 416, and is connected in a heat insulating manner (not shown) to the transfer tube 404. Furthermore, although not shown, the low temperature portion prevents heat penetration due to radiation heat from the room temperature portion by the shield plate reducing the thermal radiation, the stacked layer heat insulating material, and the like in the vacuum heat insulating container 416.

The transfer tube 404 is securely fixed and supported on the floor 20 or a supporting body 417 installed on the floor 20. Although not shown, the piping 403, 407, 413, 415 are fixed and supported by a plastic heat insulating body with glass fiber or a heat insulating material having low thermal conductivity at inside the transfer tube 404. The piping 403, 407, 413, 415 are also fixed and supported on the floor 20.

The transfer tube 404 is also securely fixed and supported by a supporting body 418 installed on the base plate 18 at near the gas field ion source 1. Similarly, although not shown, the piping 403, 407, 413, 415 are fixed and supported by a plastic heat insulating body with glass fiber or a heat insulating material having low thermal conductivity at inside of the transfer tube 404. The piping 403, 407, 413, 415 are also fixed and supported on the base plate 18.

In other words, the cooling mechanism is a coldness generation means for generating coldness by expanding a first high pressure gas generated by the compressor unit 16, and a cooling mechanism for cooling a body to be cooled with helium gas or a second moving cooling medium cooled with the coldness of the coldness generation means and circulated with the compressor unit 400.

The cooling conduction rod 53 is connected to the emitter tip 21 through the deformable cooper stranded wire 54 and the sapphire base. The cooling of the emitter tip 21 is thereby realized. In the present example, the GM refrigerator becomes a factor for vibrating the floor, but the gas field ion source 1, the ion beam irradiation system column 2, the vacuum sample chamber 3 and the like are installed isolated from the GM refrigerator. Furthermore, the piping 403, 407, 413, 415 coupled to the heat exchangers 405, 414 installed in the vicinity of the gas field ion source 1 are securely fixed and supported on the floor 20 or the base 18 that barely vibrates. The piping thus do not vibrate. Furthermore, the gas field ion source 1, the ion beam irradiation system column 2, the vacuum sample chamber 3, and the like are vibration insulated from the floor and thus are systems in which the transmission of mechanical vibration is extremely small.

In other words, according to the gas field ion source of the present example, a gas field ion source and an ion microscope in which the mechanical vibration can be reduced and high resolution observation can be carried out.

Furthermore, in the present example as well, the vibration proofing mechanism may be arranged on the base plate 18 that supports the gas field ion source 1, the ion beam irradiation system column 2, and the sample chamber 3. The reduction and transmission of the mechanical vibration are thereby prevented, enabling high resolution observation.

The inventors of the present application found that the sound of the compressor 16 or 400 vibrates the gas field ion source 1 and degrades the resolution thereof. Thus, a cover 419 for spatially separating the compressor and the gas field ion source is arranged in the present example. The influence of the vibration caused by the sound of the compressor thus can be reduced. High resolution observation also can be carried out. In the examples shown in FIG. 1, FIG. 7, and FIG. 8 as well, the cover may be arranged to reduce the influence of the vibration caused by the sound of the compressor.

In the case of the present example, the second helium gas is circulated using the compressor unit (compressor) 400. However, although not shown, the piping 111, 112 of the helium compressor 16 and the piping 403, 414 may be communicated through a flow rate adjustment valve, respectively. Some of the helium gas from the helium compressor 16 thus can be supplied into the piping 409 as a second helium gas, that is, the circulating helium gas, and the gas can be collected to the helium compressor 16 from the piping 416. Similar effect thus can be obtained.

The GM refrigerator 401 is used in the present example, but instead, a pulse tube refrigerator or a sterling refrigerator may be used. Furthermore, the refrigerator includes two cooling stages in the present example, but may include a single cooling stage, where the number of cooling stages is not particularly limited. For example, a small sterling refrigerator having one cooling stage may be used. A compact and low-cost ion beam device thus can be realized with a helium circulating refrigerator in which the lowest cooling temperature is 50 K. In such a case, neon gas or hydrogen may be used in place of the helium gas.

A fifth example of the ion microscope according to the present invention will be described with reference to FIG. 10A and FIG. 10B. The structure of the gas molecule ionization chamber of the gas field ion source will now be described. The present example has characteristics in the vacuum exhaust mechanism of the gas molecule ionization chamber. In the gas molecule ionization chamber 15 of the present example, an opening is formed in the top plate 29, and an open/close valve is attached to the opening 31. The open/close valve includes a lid member 32 for closing the opening 31 and an operation rod 33 attached to the lid member 32. The operation rod 33 passes through the shield reducing the thermal radiation 58 or the vacuum chamber 68 and extends to the outside of the vacuum chamber. The operation rod 33 is configured to be operable at the outer side of the vacuum chamber.

Figure 10A:
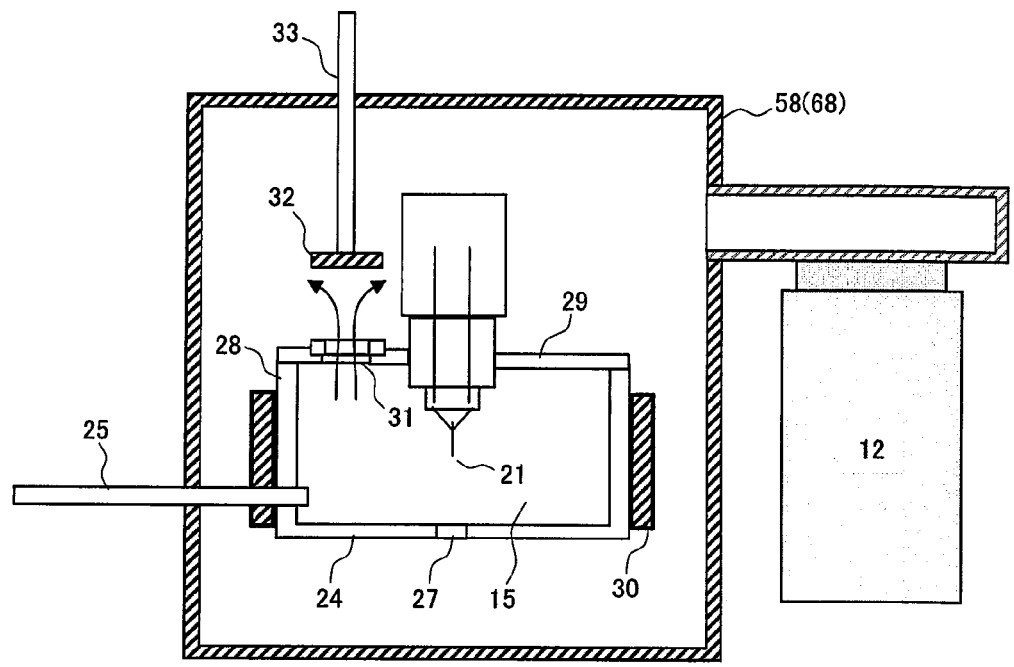
FIG. 10A is a view describing the operation of an open/close valve (open state) of the gas molecule ionization chamber of the gas field ion source of a fifth example of the ion microscope according to the present invention.
Figure 10B:
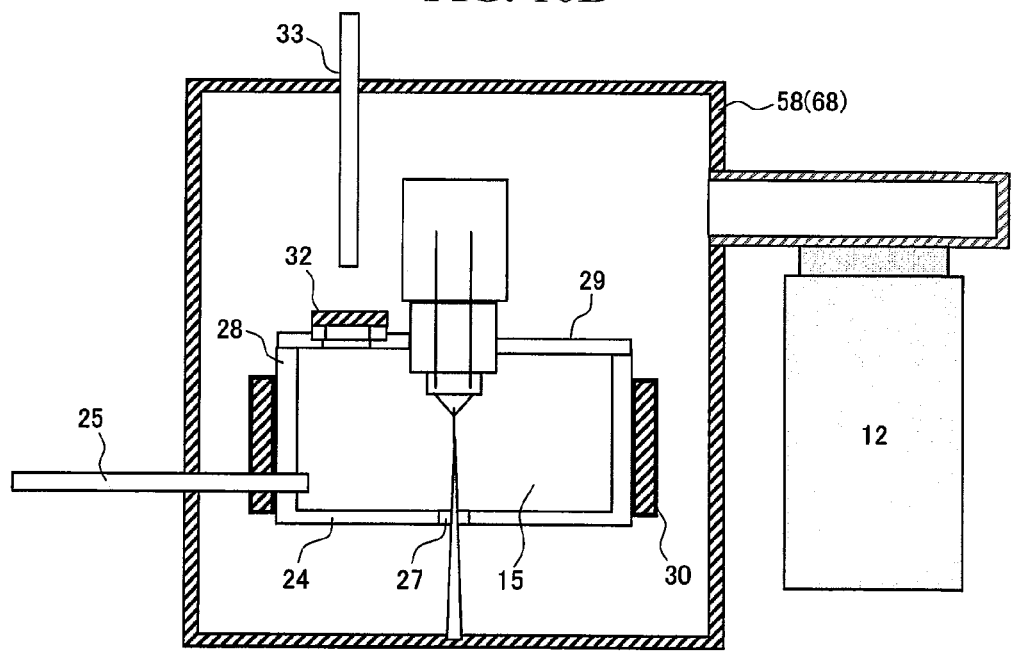
FIG. 10B is a view describing the operation of the open/close valve (close state) of the gas molecule ionization chamber of the gas field ion source of the fifth example of the ion microscope according to the present invention.

FIG. 10A shows a state in which the lid member 32 is separated from the opening 31. In this case, the open/close valve is isolated from a wall structure of the gas molecule ionization chamber 15, and can prevent the heat from flowing into the gas molecule ionization chamber 15 through the open/close valve. In other words, it is suitable for lowering the temperature of the gas molecule ionization chamber. FIG. 10B shows a state in which the opening 31 is closed by the lid member 32. In this case, the gas molecule ionization chamber 15 is sealed excluding the gas supply piping 25 and the hole 27.

The operation of the gas field ion source of the present example will now be described. First, as shown in FIG. 10A, coarse exhaust is carried out with the opening 31 of the gas molecule ionization chamber 15 opened. The emitter tip 21 prepared in advance is attached, and the vacuum chamber is exhausted by the vacuum pump 12. The conductance with respect to the vacuum exhaust system of the gas molecule ionization chamber 15 is relatively large when the opening 31 is opened. Therefore, the coarse exhaust of the gas molecule ionization chamber 15 is completed in a short period of time.

Therefore, according to the present example, the conductance in time of coarse vacuum can be increased even if the dimension of the hole 27 of the extraction electrode 24 is reduced by forming the opening 31 in the gas molecule ionization chamber 15. The gas molecule ionization chamber 15 can be sealed by reducing the dimension of the hole of the extraction electrode. Thus, high vacuuming of the gas molecule ionization chamber 15 can be realized, and the ion beam of large current is obtained.

The extraction electrode 24, the side wall 28, and the top plate 29 can be degassed by heating with the resistive heater 30 on the outer side of the side wall of the gas molecule ionization chamber 15. In the present example as well, another resistive heater for degassing process may be arranged on the outer side of the vacuum chamber. The residual gas concentration lowers and the degree of vacuum enhances by the degassing process of the vacuum chamber. The time stability of the ion release current can be enhanced by the degassing process. The opening 31 of the gas molecule ionization chamber 15 is then closed, and the helium is supplied from the gas supply piping 25, as shown in FIG. 10B. High voltage is supplied to the emitter tip 21 to apply the extraction voltage to the extraction electrode 24. The ion beam is generated from the distal end of the emitter tip 21.

In the present example, the resistive heater 30 is arranged on the outer side of the gas molecule ionization chamber 15. Thus, degassing of the resistive heater itself is carried out outside the gas molecule ionization chamber 15. The interior of the gas molecule ionization chamber 15 thus becomes higher vacuum.

A sixth example of the ion microscope according to the present invention will be described with reference to FIG. 11A and FIG. 11B. The structure of the gas molecule ionization chamber of the gas field ion source will be described below. The present example has characteristics in the wiring structure of the gas molecule ionization chamber. The gas field ion source includes a heating power supply 134 for heating the emitter tip 21, a high voltage power supply 135 for supplying an accelerating voltage for accelerating ions to the emitter tip 21, an extraction power supply 141 for supplying an extraction voltage for extracting ions to the extraction electrode 24, and a heating power supply 142 for heating the resistive heater 30.

The heating power supplies 134, 142 may be 10V, the high voltage power supply 135 may be 30 kV, and the extraction power supply 141 may be 3 kV.

Figure 11A:
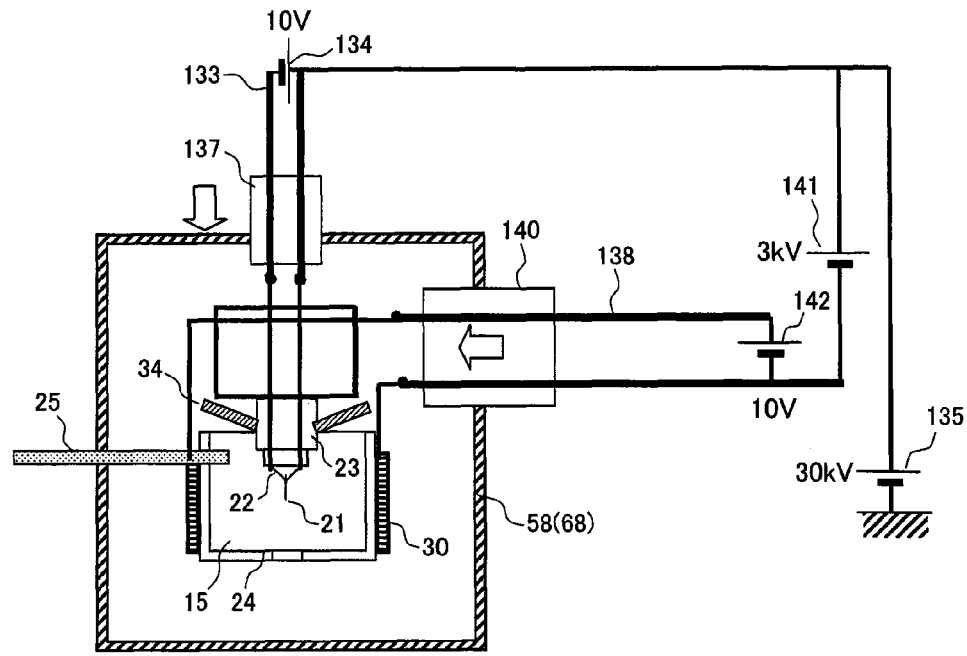
FIG. 11A is a view describing the operation of a disconnecting mechanism (connected state) of the wiring at the periphery of the gas molecule ionization chamber of the gas field ion source of a sixth example of the ion microscope according to the present invention.

As shown in FIG. 11A, a filament 22 and the high voltage power supply 135 are connected by a thick wire 133 made of copper and a thin wire 136 made of stainless steel. The filament 22 and the heating power supply 134 are connected by the thick wire 133 made of copper. The resistive heater 30 and the heating power supply 142 are connected by a thick wire 138 made of copper. The extraction electrode 24 and the resistive heater 30 have the same potential.

Figure 11B:
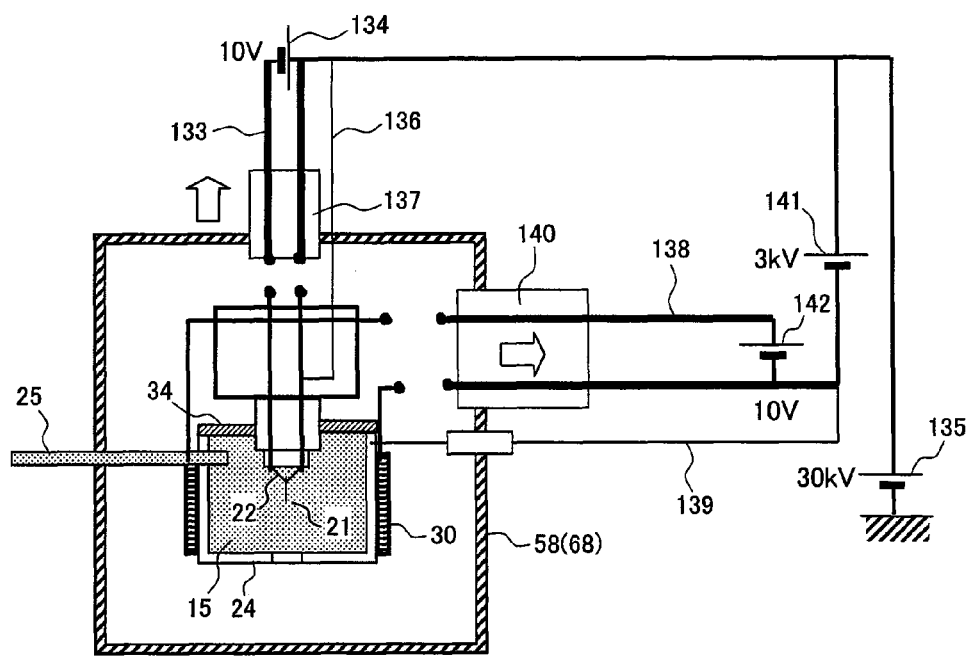
FIG. 11B is a view describing the operation of a disconnecting mechanism (disconnected state) of the wiring at the periphery of the gas molecule ionization chamber of the gas field ion source of the sixth example of the ion microscope according to the present invention.

As shown in FIG. 11B, the filament 22 and the high voltage power supply 135 are connected by the thin wire 136 made of stainless steel. The extraction electrode 24 and the extraction power supply 141 are connected by the thin wire 139 made of stainless steel.

A disconnecting mechanism 137 is arranged on the thick wire 133 made of copper. The disconnecting mechanism 137 includes a movable mechanism, and is configured to move between two positions, a disconnecting position of disconnecting the thick wire 133 made of copper from the filament 22 and a connecting position of connecting the thick wire 133 made of copper to the filament 22. A disconnecting mechanism 140 is arranged on the thick wire 138 made of copper. The disconnecting mechanism 140 includes a movable mechanism, and is configured to move between two positions, a disconnecting position of disconnecting the thick wire 138 made of copper from the resistive heater 30 and a connecting position of connecting the thick wire 138 made of copper to the resistive heater 30. FIG. 11A shows a state in which the disconnecting mechanisms 137, 140 are both at the connecting position, and FIG. 11B shows a state in which the disconnecting mechanisms 137, 140 are both at the disconnecting position. When the disconnecting mechanisms 137, 140 are both at the disconnecting position, the heat is prevented from flowing into the filament 22 and the extraction power supply 141 through the thick wires 133, 138 made of copper, respectively. The disconnecting mechanisms 137, 140 are operable from outside the vacuum chamber.

In the present example as well, an open/close valve for opening and closing the gas molecule ionization chamber 15 is attached. The open/close valve includes a lid member 34. FIG. 11A shows a state in which the lid member 34 is opened, and FIG. 11B shows a state in which the lid member 34 is closed.

The operation of the gas field ion source of the present example will be described. First, as shown in FIG. 11A, coarse exhaust is carried out with the lid member 34 of the gas molecule ionization chamber 15 opened. The coarse exhaust of the gas molecule ionization chamber 15 is completed in a short period of time since the lid member 34 of the gas molecule ionization chamber 15 is opened.

The extraction electrode 24, the side wall 28, and the top plate 29 are performed with the degassing process by being heated by the resistive heater 30 on the outer side of the side wall of the gas molecule ionization chamber 15. After the degassing process is completed, the disconnecting mechanism 140 is moved to the disconnecting position, as shown in FIG. 11B. The heat is thus prevented from flowing into the gas molecule ionization chamber 15 through the thick wire 138 made of copper.

The lid member 34 of the gas molecule ionization chamber 15 is then closed, and the helium is supplied from the gas supply piping 25. High voltage is then supplied to the emitter tip 21 to apply the extraction voltage to the extraction electrode 24. After the ion beam is generated from the distal end of the emitter tip 21, the disconnecting mechanism 137 is moved to the disconnecting position. The heat is thus prevented from flowing into the gas molecule ionization chamber 15 through the thick wire 133 made of copper. When the disconnecting mechanism 137 is at the disconnecting position, the accelerating voltage from the high voltage power supply 135 is not applied to the filament 22 through the thick wire 133 made of copper but is applied to the filament 22 through the thin wire 136 made of stainless steel. When the disconnecting mechanism 140 is at the disconnecting position, the extraction voltage from the extraction power supply 141 is not applied to the extraction power supply 141 through the thick wire 138 made of copper but is applied to the filament 22 through the thin wire 139 made of stainless steel. The filament 22 and the extraction power supply 141 are connected on a steady basis to the thin wires 136, 139 made of stainless steel. Therefore, there is a possibility the heat may flow into the gas molecule ionization chamber 15 through the thin wires 136, 139 made of stainless steel. However, the heat transferring amount through the thin wires 136, 139 made of stainless steel is sufficiently small since the thin wires 136, 139 made of stainless steel have sufficiently small cross-sections.

According to the wiring structure of the present example, the flow of heat from the copper wiring to the gas molecule ionization chamber 15 can be avoided. Thus, the emitter tip and the extraction electrode can be held at the desired temperatures. In other words, enhancement in the luminance of the ion source and larger current of the ion beam can be achieved. Furthermore, high resolution observation can be carried out.

According to the present example, the conductance in time of coarse vacuuming can be increased even if the dimension of the hole of the extraction electrode is reduced by arranging the lid member 34 on the gas molecule ionization chamber 15. The gas molecule ionization chamber 15 can be sealed by reducing the dimension of the hole of the extraction electrode. Thus, high vacuuming of the gas molecule ionization chamber 15 can be realized, and the ion beam of large current is obtained.

Figure 7:
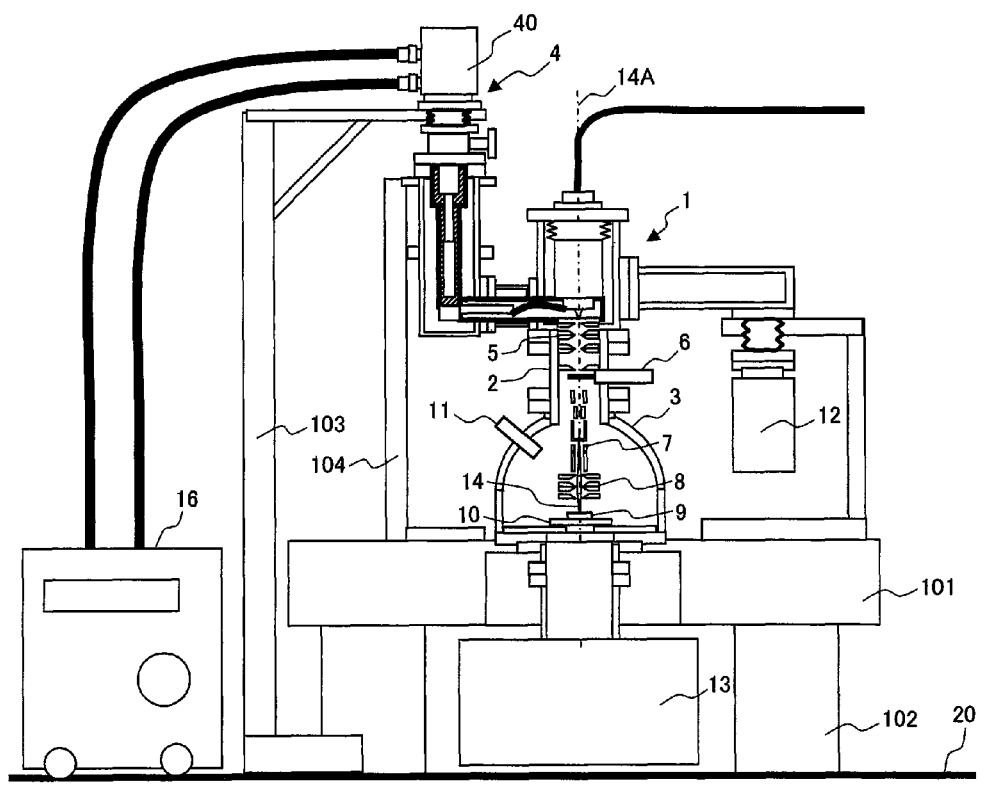
FIG. 7 is a schematic configuration view of a second example of the ion microscope according to the present invention.
Figure 8:
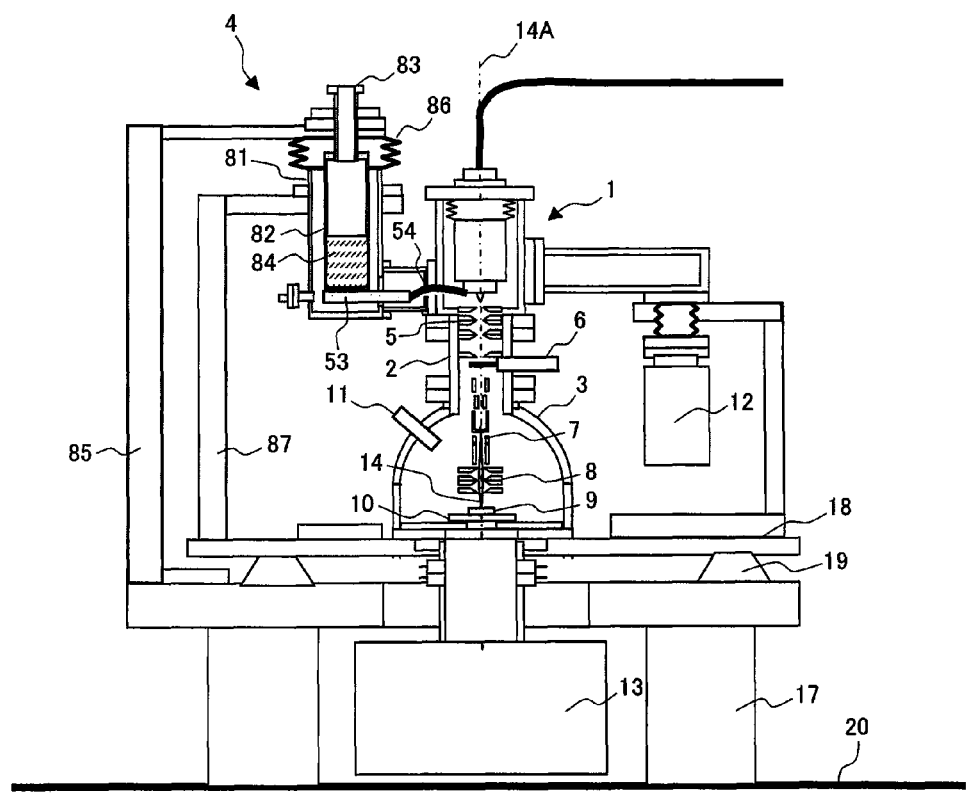
FIG. 8 is a schematic configuration view of a third example of the ion microscope according to the present invention.

The wiring structure described herein can be applied even in the examples shown in FIG. 1, FIG. 7, and FIG. 8.

In the scanning ion microscope described above, a scanning ion image can be obtained by scanning the ion beam with the ion beam scanning electrode. In this case, however, the ion beam distorts since the ion beam inclines when the ion beam passes the ion lens. Thus, the problem in that the beam diameter does not become small arises. The sample stage may be scanning moved mechanically in two orthogonal directions instead of scanning the ion beam. In this case, the scanning ion image can be obtained on the image display means of the calculation processing device by detecting the secondary particles released from the sample and luminance modulating the same. In other words, the high resolution observation of less than 0.5 nm of the sample surface can be realized. In this case, the distortion of the ion beam can be made relatively small since the ion beam can be held constantly in the same direction with respect to the objective lens.

This can be realized using the sample stage in which the first and second stages are combined. The first stage is a four-axes movable stage that can move a few centimeters, and can move in two perpendicular directions (X, Y directions) in plane, move in the height direction (Z direction), and incline (T direction). The second stage is a two-axes movable stage that can move a few micrometers, and can move in two perpendicular directions (X, Y directions) in plane.

For instance, the second stage by a piezoelectric element drive is arranged on the first stage of electric motor drive. The sample is moved using the first stage in the case of searching the observation position of the sample, and the like, and is finely moved using the second stage in the case of the high resolution observation. The ion microscope enabling super-high resolution observation is thereby provided.

Figure 12:
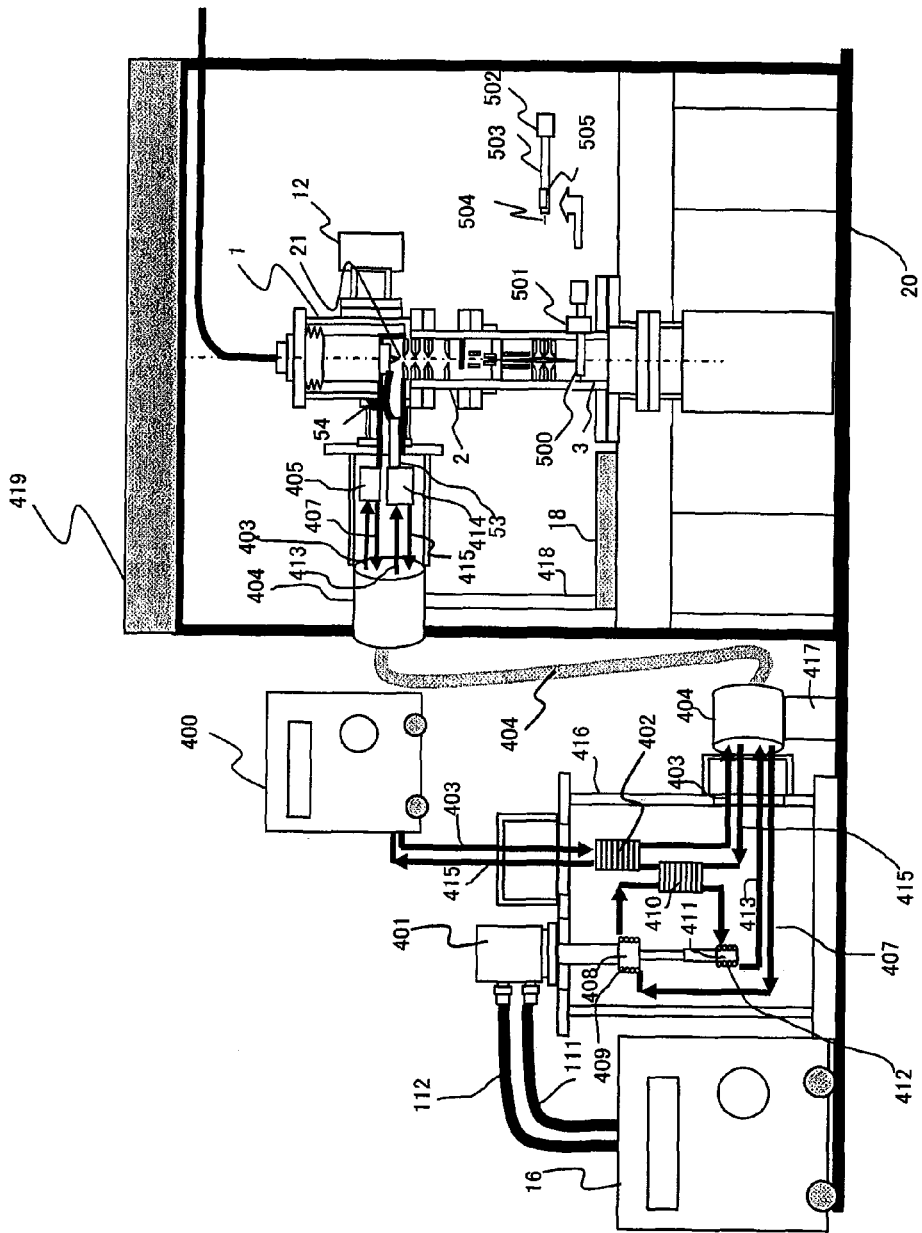
FIG. 12 is a schematic configuration view of a seventh example of the ion microscope according to the present invention.

A seventh example of the ion microscope according to the present invention will now be described with reference to FIG. 12. The ion microscope of the present example adopts a refrigerator mechanism of helium circulating type used in the ion microscope of the fourth example shown in FIG. 9. The seventh example differs from the fourth example in the sample stage. Here, the sample stage is a side entry type.

The side entry type sample stage 500 of the present example can be inserted to the ion beam device without opening the vacuum of the sample chamber 3. The vacuum does not need to be broken when taking out the side entry type sample stage 500. The side entry type sample stage 500 has a structure of being mounted on a sample stage fine movement mechanism 501. The sample can be moved in X, Y perpendicular directions with respect to the ion beam by the sample stage fine movement mechanism 501. The side entry type sample stage 500 includes a circular column portion 503, a grip portion 502 for operating the sample stage, and a sample mounting portion 505. Furthermore, a microscopic projection 504 that contacts the interior wall surface of the sample chamber is arranged at the distal end of the sample stage. In the present ion beam device, the sample stage is fixed by the microscopic projection 504. Thus, the vibration of the sample is reduced thereby enabling the observation of super-high resolution. Conventionally, such side entry type sample stage is not adopted in the ion beam device having the resolution performance of smaller than or equal to 1 nm. In particular, in order to exhibit the performance of the ion beam device to a maximum extent, the inventors focused on the relative position fluctuation of the emitter and the sample and found that the gas field ion source and the sample chamber are to have a structure of small vibration and that the sample stage suitable for realizing such strong device structure is the side entry type sample stage.

Although not shown, an electron gun for neutralizing the charge up of the sample of when the ion beam is irradiated, or a gas gun for supplying reactive gas to the vicinity of the sample is sometimes arranged in the side entry type sample stage. In such a case as well, an effect that the spatial interference with the sample stage can be relatively easily avoided is obtained in the side entry type sample stage. The distance, that is, the work distance between the sample and the objective lens thus can be reduced. The super resolution is thereby realized. The features of the ion beam device using the gas field source ion source are also exhibited.

In the ion beam device according to the present invention described above, it was found that high resolution that is difficult even with the scanning electronic microscope of the prior art can be achieved. In particular, the ion beam device of super-high resolution of smaller than or equal to 0.2 nm can be achieved by having the magnification at which the ions released from the emitter tip are projected on the sample to be smaller than 0.2, and the fluctuation with respect to time of the relative position of the emitter tip and the sample to be smaller than or equal to 0.1 nm. Large current is essentially obtained if the magnitude at which the ions released from the emitter tip are projected on the sample is about 0.5 to 1, but cost is required for the countermeasures of vibration. Thus, it is found that if the magnitude is smaller than or equal to 0.2 so that the vibration of the emitter is reduced on the sample and the current is increased by cooling the emitter temperature to lower than or equal to 50 K, large current can be obtained and the ion beam device of high resolution can be achieved.

The scanning ion microscope has been described above as an example of the ion beam device of the present invention. However, the ion beam device of the present invention is applicable not only to the scanning ion microscope but also to the transmission ion microscope and the ion beam processing device.

The vacuum pump 12 for vacuum exhausting the gas field ion source will now be described. The vacuum pump 12 is suitably configured by a combination of a non-evaporative getter pump and an ion pump, a combination of a non-evaporative getter pump and a noble pump, or a combination of a non-evaporative getter pump and an excel pump. A sublimation pump may be used. It is found that the influence of the vibration of the vacuum pump 12 can be reduced and high resolution observation can be carried out using such pump. It is found that when using a turbo molecular pump for the vacuum pump 12, the vibration of the turbo molecular pump may inhibit the observation in time of the sample observation by the ion beam. However, it is recognized that high resolution observation can be carried out by stopping the turbo molecular pump in time of the sample observation by the ion beam even if the turbo molecular pump is attached to any one of the vacuum chambers of the ion beam device. In other words, although the main vacuum exhaust pump in time of the sample observation by the ion beam is configured by a combination of the non-evaporative getter pump and the ion beam, a combination of the non-evaporative getter pump and the noble pump, or a combination of the non-evaporative getter pump and the excel pump in the present invention, the object of the present invention is not obstructed even with the configuration of attaching the turbo molecular pump.

The non-evaporative getter pump is a vacuum pump configured using an alloy that gas adsorbs by activation through heating. When using helium for the ionized gas of the gas field ion source, the helium exists in a relatively large amount in the vacuum chamber. However, the non-evaporative getter pump barely exhausts the helium. Thus, the getter surface does not saturate with the adsorption gas molecules. Thus, the operation time of the non-evaporative getter pump is sufficiently long. This is the advantage of when the helium ion microscope and the non-evaporative getter pump are combined. An effect in that the ion release current stabilizes as the impurity gas in the vacuum chamber reduces is also obtained.

Although the non-evaporative getter pump exhausts the residual gas other than the helium at a large exhaust speed, the helium will still retain in the ion source. Thus, the degree of vacuum becomes insufficient and the gas field ion source does not normally operate. The ion pump or the noble pump in which the exhaust speed of an inactive gas is large is thus used in combination with the non-evaporative getter pump. The exhaust speed is insufficient with only the ion pump or the noble pump. According to the present invention, a compact and low cost vacuum pump 12 can be obtained by combining the non-evaporative getter pump and the ion pump or the noble pump. A getter pump or a titanium sublimation pump for adsorbing the gas molecules with a metal film by heat evaporating the metal such as titanium to vacuum exhaust may be used in combination for the vacuum pump 12.

The performance of the ion microscope is not sufficiently obtained due to lack of consideration on the mechanical vibration in the prior art, but the present invention provides a gas field ion source and an ion microscope in which the mechanical vibration is reduced and the high resolution observation is enabled.

The sample chamber vacuum exhaust pump 13 for vacuum exhausting the sample chamber 3 will now be described. The sample chamber vacuum exhaust pump 13 may be a getter pump, a titanium sublimation pump, a non-evaporative getter pump, an ion pump, a noble pump, an excel pump, or the like. It is found that the influence of the vibration of the sample chamber vacuum exhaust pump 13 can be reduced and the high resolution observation can be carried out using such pump.

The turbo molecular pump may be used for the sample chamber vacuum exhaust pump 13. However, cost is required to realize the vibration-alleviating structure of the device. Furthermore, it is recognized that high resolution observation can be carried out by stopping the turbo molecular pump in time of the sample observation by the ion beam even if the turbo molecular pump is attached to the sample chamber. In other words, the main vacuum exhaust pump in time of the sample observation by the ion beam is configured by a combination of the non-evaporative getter pump and the ion beam, a combination of the non-evaporative getter pump and the noble pump, or a combination of the non-evaporative getter pump and the excel pump in the present invention. However, the object of the present invention is not obstructed even if the turbo molecular pump is attached in the device configuration to use for coarse vacuuming from the atmosphere.

In the scanning electron microscope, the resolution of smaller than or equal to 0.5 can be relatively easily achieved using the turbo molecular pump. However, in the ion microscope using the gas field ion source, the reduction rate of the ion beam from the ion light source to the sample is relatively large or about 1 to 0.5. The properties of the ion source thus can be exhibited to a maximum extent. However, since the vibration of the ion emitter is reproduced on the sample without practically being reduced, cautious countermeasures are necessary even in comparison with the vibration countermeasures of the scanning electron microscope and the like of the prior art.

In the prior art, consideration is made in that the vibration of the sample chamber vacuum exhaust pump influences the sample stage, but consideration is not made in that the vibration of the sample chamber vacuum exhaust pump also influences the ion emitter. The inventors of the present application thus found that the vibration of the sample chamber vacuum exhaust pump seriously influences the ion emitter. The inventors of the present invention believed that it is good to use a non-vibrating vacuum pump such as the getter pump, the titanium sublimation pump, the non-evaporative getter pump, the ion pump, the noble pump, and the excel pump as the main pump for the sample chamber vacuum exhaust pump. This reduces the vibration of the ion emitter and enables high resolution observation.

The compressor unit (compressor) of the gas of the refrigerator used in the present example or the compressor unit (compressor) for circulating the helium has a possibility of being the sound source of noise. The noise may vibrate the ion microscope. Thus, according to the present invention, the noise generated by the compressor unit of gas is prevented from being transmitted to the outside by arranging the cover on the compressor unit (compressor) of gas. A sound shielding plate may be arranged instead of the cover. The compressor unit (compressor) may be installed in a different room. The vibration caused by sound thus reduces thereby enabling high resolution observation.

The non-evaporative getter material may be arranged in the gas molecule ionization chamber. High vacuuming of the gas molecule ionization chamber and highly stable ion release are thereby achieved. Hydrogen may be adsorbed to the non-evaporative getter material or hydrogen storing alloy, and then heated. The hydrogen thereby released is used as the ionized gas, so that gas does not need to be supplied from the gas supply piping 25 and a compact and safe gas supplying mechanism can be realized.

The non-evaporative getter material may be arranged in the gas supply piping 25. The impurity gas in the gas supplied through the gas supply piping 25 reduces by the non-evaporative getter material. Thus, the ion release current stabilizes.

In the present invention, helium or hydrogen is used for the ionized gas supplied to the gas molecule ionization chamber 15 through the gas supply piping 25. However, neon, oxygen, argon, krypton, xenon, or the like may be used for the ionized gas. In particular, when using neon, oxygen, argon, krypton, xenon, and the like, an effect in that the device for processing the sample or the device for analyzing the sample can be provided is obtained.

When using inactive gas such as helium, neon, argon, krypton, or xenon, the non-evaporative getter material may be arranged in the gas supply piping 25. Alternatively, a gas tank may be arranged in the middle of the gas supply piping 25, and the non-evaporative getter material may be arranged in the gas tank. The gas other than the ionized gas is thereby adsorbed and the inactive gas can be purified. The ion release current thereby stabilizes.

A mass spectrometer may be arranged in the sample chamber 3. The mass spectrometry of the secondary ion released from the sample is carried out with the mass spectrometer. Alternatively, the Auger electron released from the sample may be energy analyzed. The element analysis of the sample is thereby facilitated, and the sample observation by the ion microscope and the element analysis can be carried out in one device.

In the ion microscope of the present invention, the electrons can be extracted from the emitter tip by applying a high negative voltage to the emitter tip. The sample is irradiated with such electron beam to detect the X ray or the Auger electrons released from the sample. The element analysis of the sample is thereby facilitated, and the sample observation of super-high resolution by the ion microscope and the element analysis can be carried out in one device.

Furthermore, in this case, the ion image and the element analysis image having a resolution of smaller than or equal to 1 nm may be displayed side by side or overlapped. The sample surface thus can be suitably performed with characterization.

In this case, the electron beam can be focused to a microscopic beam diameter at a large current thereby enabling a highly sensitive element analysis at high spatial resolution by using a compound lens in which a magnetic field lens and an electrostatic lens are combined to the objective lens for focusing the electron beam.

Although the disturbance of the external magnetic field is not taken into consideration in the conventional ion beam device, it was found that the magnetism can be shielded when focusing the ion beam to smaller than 0.5 nm. Thus, super-high resolution can be achieved by creating the gas field ion source and the ion beam irradiation system, as well as the vacuum chamber of the sample chamber with pure iron or permalloy. Moreover, a plate for shielding magnetism may be inserted in the vacuum chamber.

The inventors of the present application found that more accurate measurement can be made by measuring the structural dimension of the semiconductor sample with the accelerating voltage of the ion beam at greater than or equal to 50 kV. This is because the extent of breaking the structure of the sample lowers and the dimension measurement accuracy enhances when the sputtering yield of the sample by the ion beam lowers. In particular, the sputtering yield lowers and the accuracy of the dimension measurement enhances when hydrogen is used for the ionized gas.

Therefore, according to the present invention, an analyzer suitable for measuring the structural dimension on the sample with the ion beam, and a length measurement device or an examination device using the ion beam can be provided.

Furthermore, according to the present invention, accurate measurement can be carried out compared to the measurement using the electron beam of the prior art since the focal length of the image obtained is deep. Furthermore, the amount the sample surface is scraped becomes small and accurate measurement can be carried out if hydrogen, in particular, is used for the ionized gas.

According to the present invention, a length measurement device or an examination device using an ion beam suited for measuring the structural dimension on the sample is provided.

According to the present invention, a device and a cross-section observation method for forming a cross-section by processing with the ion beam and observing the cross-section with the ion microscope can be provided in place of a device for forming a cross-section by processing the sample with the ion beam and observing the cross-section with the electron microscope.

According to the present invention, a device in which sample observation by the ion microscope, the sample observation by the electron microscope, and the element analysis can be performed with one device, an analyzer for observing and analyzing defects, foreign substances, and the like, and an examination device can be provided.

The ion microscope realizes a super-high resolution observation. However, when the ion beam was conventionally used as the measurement device or the examination device of the structural dimension in the manufacturing process of the semiconductor sample, a review on the influence on manufacturing of the breakage of the surface of the semiconductor sample for the ion beam irradiation as opposed to the electron beam irradiation is not made. For instance, the proportion the sample alters is small when the energy of the ion beam is smaller than 1 keV, whereby the accuracy of the dimension measurement enhances compared to when the energy of the ion beam is 20 keV. An effect in the cost of the device also reduces is obtained in this case. If the accelerating voltage is greater than or equal to 50 kV, on the other hand, the observation resolution can be lowered compared to when the accelerating voltage is low.

Furthermore, the inventors of the present application found that the three-dimensional structure including the plane and the depth of the sample element can be measured in units of atoms when the sample is irradiated with the accelerating voltage of the ion beam at greater than or equal to 200 kV and the beam diameter narrowed to smaller than or equal to 0.2 nm, and performing the energy analysis of the ions Rutherford back scattered from the sample. The three-dimensional measurement in the order of atoms was difficult in the conventional Rutherford back scattering device as the ion beam diameter is large, but this can be realized by applying the present invention.

The two-dimensional analysis of the sample element can be carried out by irradiating the sample with the accelerating voltage of the ion beam at greater than or equal to 500 kV and the beam diameter narrowed to smaller than or equal to 0.2 nm, and performing the energy analysis of the X ray released from the sample.

According to the present invention, the following gas field ion source, the ion microscope, and the ion beam device are disclosed.

(1) A gas field ion source, configured by a vacuum chamber, a vacuum exhaust mechanism, an emitter tip that composes a needle-shaped anode and an extraction electrode that composes a cathode in the vacuum chamber, for supplying gas molecules to a vicinity of a distal end of the emitter tip and ionizing the gas molecules with an electric field at the distal end of the emitter tip; wherein a mount of the emitter tip and the extraction electrode are connected including a shape changeable mechanism component, an ionization chamber in which the emitter tip is substantially surrounded by at least the mount of the emitter tip, the extraction electrode, and the shape changeable mechanism component is deformable in the vacuum chamber while barely contacting the vacuum chamber.

(2) The gas field ion source according to (1), wherein a gas pressure of the ionization chamber is greater by greater than or equal to at least one digit than a gas pressure of the vacuum chamber when the gas molecule is supplied to the ionization chamber.

(3) The gas field ion source according to (1), wherein the mount of the emitter tip is connected to the vacuum chamber including a shape changeable mechanism component different from the shape changeable mechanism component.

(4) The gas field ion source according to (1) to (3), wherein the shape changeable mechanism component is a bellows.

(5) The gas field ion source according to (4), wherein a minimum diameter of the bellows between the mount of the emitter tip and the extraction electrode is smaller than a maximum diameter of the bellows between the mount of the emitter tip and the vacuum chamber.

(6) An ion beam device comprising an ion beam device main body including a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip, a lens system for focusing an ion beam extracted from the emitter tip, a sample chamber incorporating a sample, and a secondary particle detector for detecting secondary particles released from the sample; a base plate to mount the ion beam device main body; and a mount for supporting the base plate, wherein a vibration proofing mechanism is arranged between the ion beam device main body and the base plate, the cooling mechanism is supported by a supporting mechanism fixed to a floor, on which the ion beam device is installed, or an ion beam device mount, and a vibration proofing mechanism is arranged between a refrigerator and the vacuum chamber.

(7) The ion beam device according to (6), wherein the cooling mechanism is a coldness generation means for generating coldness by expanding a high pressure gas generated in a compressor unit, and a refrigerator for cooling a stage with the coldness of the coldness generation means.

(8) The ion beam device according to (6), wherein the cooling mechanism is a coldness generation means for generating coldness by expanding a first high pressure gas generated in a compressor unit, and a cooling means for cooling a body to be cooled with a gas cooled with the coldness of the coldness generation means.

(9) The ion beam device according to (6), wherein the cooling mechanism is a coldness generation means for generating coldness by expanding a first high pressure gas generated in a compressor unit, and a cooling means for cooling a body to be cooled with a second high pressure gas cooled with the coldness of the coldness generation means.

(10) The ion beam device according to (6), wherein the vibration proofing mechanism between the refrigerator and the vacuum chamber at least includes a mechanism for inhibiting transmission of vibration with helium or neon gas.

(11) The ion beam device according to (6), wherein at least a shape changeable mechanism component exists between a cooling stage of the cooling mechanism and the emitter tip.

(12) The ion beam device according to (6), wherein the cooling mechanism is a mechanism for holding a cooling agent in which a cooling medium gas, which is in a gas state under normal temperature and atmosphere pressure, is in a liquid or solid state by the vacuum chamber, the vacuum chamber being connected with the vacuum chamber of the ion beam device with at least one vibration free mechanism component in between, and an area cooled by the cooling agent and the emitter tip being connected with at least one shape changeable mechanism component in between.

(13) The gas field ion source according to (1), wherein a mechanism for varying a conductance for vacuum exhausting the gas molecule ionization chamber is a valve operable from outside the vacuum chamber, and is mechanically separable with a wall structure body of the ionization chamber.

(14) The gas field ion source according to (1), further including a resistive heater for heating the gas molecule ionization chamber, wherein mechanical disconnection with a plurality of electric wirings connected to the resistive heater is carried out by operating at least one of the plurality of electric wirings from outside in vacuum.

(15) The gas field ion source according to (1), wherein a cooling agent of the cooling mechanism is a cooling agent in which a cooling medium gas, which is in a gas state under normal temperature and atmosphere pressure, is in a solid state.

(16) An ion microscope comprising:
the gas field ion source according to any one of (1) to (5) or (13) to (15).
a lens system for focusing ions extracted from the gas field ion source;
a secondary particle detector for detecting secondary particles; and
an image display unit for displaying an ion microscope image.

According to the present invention, the following ion microscope, ion beam device, and an ion beam examination device are disclosed.

(17) An ion beam device comprising a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; an objective lens and a lens for focusing an ion beam extracted from the emitter tip; a sample chamber incorporating a sample; and a secondary particle detector for detecting secondary particles released from the sample; wherein an ion beam diameter can be focused to 0.5 nm by reducing a distance from a distal end of the objective lens to a surface of the sample to less than 2 mm.

(18) An ion microscope comprising a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; a lens system for focusing an ion beam extracted from the emitter tip; a sample chamber incorporating a sample; and a secondary particle detector for detecting secondary particles released from the sample; wherein the sample chamber is heated up to about 200° C. to have a degree of vacuum of the sample chamber to smaller than or equal to $10^{-7}$ Pa at the maximum.

(19) An ion microscope comprising a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; a lens system for focusing an ion beam extracted from the emitter tip; a sample chamber incorporating a sample; a secondary particle detector for detecting secondary particles released from the sample; and a vacuum pump for vacuum exhausting the sample chamber; wherein a main vacuum pump for vacuum exhausting the sample chamber during a microscope image observation with the ion microscope includes one of a sublimation pump, a non-evaporative getter pump, an ion pump, a noble pump, or an excel pump.

(20) An ion microscope comprising a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; a vacuum pump for vacuum exhausting the gas field ion source; a lens system for focusing an ion beam extracted from the emitter tip; a sample chamber incorporating a sample; and a secondary particle detector for detecting secondary particles released from the sample; wherein a main vacuum pump for vacuum exhausting the gas field ion source during a microscope image observation with the ion microscope includes one of a sublimation pump, a non-evaporative getter pump and an ion pump, a noble pump or an excel pump.

(21) An ion beam device comprising a gas field ion source, configured by a vacuum chamber, a vacuum exhaust mechanism, an emitter tip that composes a needle-shaped anode and an extraction electrode that composes a cathode in the vacuum chamber, a container of a liquid freezing mixture for a cooling mechanism of the emitter tip, and a vacuum pump for vacuum exhausting the container of the liquid freezing mixture, for supplying gas molecules to a vicinity of a distal end of the emitter tip and ionizing the gas molecules with an electric field at the distal end of the emitter tip; a lens system for focusing an ion beam extracted from the emitter tip; a sample chamber incorporating a sample; and a secondary particle detector for detecting secondary particles released from the sample; further including a control device for controlling the operation of the vacuum pump by a vacuum degree measurement or a temperature measurement of the container of the liquid freezing mixture, and controlling the temperature of the container of the liquid freezing mixture.

(22) An ion beam device comprising a gas field ion source, configured by a vacuum chamber, a vacuum exhaust mechanism, an emitter tip that composes a needle-shaped anode and an extraction electrode that composes a cathode in the vacuum chamber, a container of a liquid freezing mixture for a cooling mechanism of the emitter tip, and a vacuum pump for vacuum exhausting the container of the liquid freezing mixture, for supplying gas molecules to a vicinity of a distal end of the emitter tip and ionizing the gas molecules with an electric field at the distal end of the emitter tip; a lens system for focusing an ion beam extracted from the emitter tip; a sample chamber incorporating a sample; and a secondary particle detector for detecting secondary particles released from the sample; wherein the cooling mechanism is a refrigerator for cooling a stage of the refrigerator with coldness of a coldness generation means for generating the coldness by expanding a high pressure gas generated in a compressor unit, a cover being arranged on the compressor unit for generating the high pressure gas to reduce noise from the compressor unit of the gas.

(23) An ion microscope comprising a gas field ion source, configured by a vacuum chamber, a vacuum exhaust mechanism, an emitter tip that composes a needle-shaped anode and an extraction electrode that composes a cathode in the vacuum chamber, a container of a liquid freezing mixture for a cooling mechanism of the emitter tip, and a vacuum pump for vacuum exhausting the container of the liquid freezing mixture, for supplying gas molecules to a vicinity of a distal end of the emitter tip and ionizing the gas molecules with an electric field at the distal end of the emitter tip, a lens system for focusing an ion beam extracted from the emitter tip, a sample stage including at least two types of moving mechanisms with respect to at least two directions within an ion beam irradiation plane, a sample chamber incorporating a sample placed on the sample stage, and a secondary particle detector for detecting secondary particles released from the sample, the sample stage is scanning moved mechanically in two orthogonal directions, and the secondary particles released from the sample are detected to obtain an ion microscope image.

(24) The ion microscope described in (23), the sample stage including at least two types of moving mechanisms with respect to at least two directions within the ion beam irradiation plane includes a stage using at least a piezoelectric element driving mechanism, an image resolution of the ion microscope image being less than 0.5 nm.

(25) An ion beam device comprising a gas field ion source, configured by a vacuum chamber, a vacuum exhaust mechanism, an emitter tip that composes a needle-shaped anode and an extraction electrode that composes a cathode in the vacuum chamber, a cooling mechanism of the emitter tip, and a gas supply piping, for supplying gas molecules to a vicinity of a distal end of the emitter tip and ionizing the gas molecules with an electric field at the distal end of the emitter tip; a lens system for focusing an ion beam extracted from the emitter tip; a sample chamber incorporating a sample; a secondary particle detector for detecting secondary particles released from the sample; and vacuum pump for vacuum exhausting the sample chamber; wherein non-evaporative getter material is arranged in the supply piping using inactive gas such as helium, neon, argon, krypton, and xenon.

(26) An ion beam device comprising a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; an objective lens and a lens for focusing an ion beam extracted from the emitter tip; a sample chamber incorporating a sample; and a secondary particle detector for detecting secondary particles released from the sample; wherein a high negative voltage is applied to the emitter tip to extract electrons from the emitter tip and irradiate the sample, an X-ray or Auger electron released from the sample is detected to enable an element analysis, and a scanning ion image having a resolution of smaller than or equal to 1 nm and an element analysis image are displayed side by side or in an overlapping manner.

(27) An ion beam examination device comprising a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; an objective lens and a lens for focusing an ion beam extracted from the emitter tip; and a sample chamber incorporating a sample; and a unit for detecting secondary particles released from the sample and measuring a structural dimension of a sample surface; wherein the structural dimension of the semiconductor sample is measured with the accelerating voltage of the ion beam at greater than or equal to 50 kV.

(28) The ion beam examination device according to (27), wherein hydrogen gas is used.

(29) An ion beam examination device comprising a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; an objective lens and a lens for focusing an ion beam extracted from the emitter tip; and a sample chamber incorporating a sample; and a unit for detecting secondary particles released from the sample and measuring a structural dimension of a sample surface; wherein the energy of ion beam is smaller than 1 keV.

(30) An ion beam device comprising a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; an objective lens and a lens for focusing an ion beam extracted from the emitter tip; a sample chamber incorporating a sample; and a secondary particle detector for detecting secondary particles released from the sample; wherein a high negative voltage is applied to the emitter tip to extract electrons from the emitter tip, passed through a compound objective lens in which a magnetic field lens and an electrostatic lens are combined and irradiated on the sample to detect an X-ray or an Auger electron released from the sample and enable an element analysis.

(31) A sample element analyzing method using an ion beam device including a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; an objective lens and a lens for focusing an ion beam extracted from the emitter tip; a sample chamber incorporating a sample; and a secondary particle detector for detecting secondary particles released from the sample; the method comprising the steps of irradiating a sample with an accelerating voltage of the ion beam at greater than or equal to 200 kV and a beam diameter narrowed to smaller than or equal to 0.2 nm; energy analyzing ions Rutherford back scattered from the sample; and measuring a three-dimensional structure including a plane and a depth of the sample element in units of atoms.

(32) A sample element analyzing method using an ion beam device including a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; an objective lens and a lens for focusing an ion beam extracted from the emitter tip; a sample chamber incorporating a sample; and a secondary particle detector for detecting secondary particles released from the sample; the method comprising the steps of irradiating a sample at greater than or equal to 500 kV and a beam diameter narrowed to smaller than or equal to 0.2 nm; energy analyzing an X ray released from the sample; and performing a two-dimensional element analysis.

(33) An ion beam device including a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; an objective lens and a lens for focusing an ion beam extracted from the emitter tip; a sample chamber incorporating a sample; and a secondary particle detector for detecting secondary particles released from the sample; wherein the emitter tip is cooled to lower than or equal to 50 K, a magnification of projecting the ion released from the emitter tip on the sample is made to smaller than 0.2, and a vibration of a relative position of the emitter tip and the sample is made to smaller than or equal to 0.1 nm so that a scanning ion image resolution is smaller than or equal to 0.2 nm.

(34) An ion beam device including a gas field ion source, configured by a vacuum chamber, a vacuum exhaust mechanism, an emitter tip that composes a needle-shaped anode and an extraction electrode that composes a cathode in the vacuum chamber, and a cooling mechanism of the emitter tip, for supplying gas molecules to a vicinity of a distal end of the emitter tip and ionizing the gas molecules with an electric field at the distal end of the emitter tip; an objective lens and a lens for focusing an ion beam extracted from the emitter tip; a sample chamber incorporating a sample; and a secondary particle detector for detecting secondary particles released from the sample; wherein the sample stage is a sample stage of side entry type, and the distal end has a structure contacting the wall surface of the sample chamber.

(35) An ion beam device comprising:
a gas field ion source for generating an ion beam;
an ion irradiation light system for guiding the ion beam from the gas field ion source to a sample;
a vacuum chamber for accommodating the gas field ion source and the ion irradiation light system;
a sample chamber for accommodating a sample stage for holding the sample; and
a cooling mechanism of a gas circulating method for cooling the gas field ion source; wherein
the cooling mechanism includes a refrigerator, a piping for connecting the refrigerator and the gas field ion source, a heat exchanger arranged on the piping, and a circulating compressor for circulating liquid helium in the piping, the piping being fixed and supported on a floor or a supporting body.

(36) An ion beam device comprising:
a gas field ion source for generating an ion beam;
an ion irradiation light system for guiding the ion beam from the gas field ion source to a sample;
a vacuum chamber for accommodating the gas field ion source and the ion irradiation light system;
a sample chamber for accommodating a sample stage for holding a sample; and
a cooling mechanism for cooling the gas field ion source; wherein
the cooling mechanism is a coldness generation means for generating coldness by expanding a first high pressure gas generated in a compressor unit, and a cooling mechanism for cooling a body to be cooled with helium gas or a second moving cooling medium cooled with the coldness of the coldness generation means and circulated with the compressor unit.

(37) An ion beam device comprising:
a gas field ion source for generating an ion beam;
an ion irradiation light system for guiding the ion beam from the gas field ion source to a sample;
a vacuum chamber for accommodating the gas field ion source and the ion irradiation light system;
a sample chamber for accommodating a sample stage for holding a sample;
a cooling mechanism for cooling the gas field ion source; and
a base plate for supporting the gas field ion source, the vacuum chamber, and the sample chamber; wherein
a mechanism for magnetic shield is arranged on an ion beam irradiation path.

(38) An ion beam device comprising:
a gas field ion source for generating an ion beam;
an ion irradiation light system for guiding the ion beam from the gas field ion source to a sample;
a vacuum chamber for accommodating the gas field ion source and the ion irradiation light system;
a sample chamber for accommodating a sample stage for holding a sample;
a cooling mechanism for cooling the gas field ion source; and
a base plate for supporting the gas field ion source, the vacuum chamber, and the sample chamber; wherein
a main material of one of the vacuum chambers of the gas field ion source and the ion beam irradiation system, and the sample chamber is iron or permalloy, and the resolution of the scanning ion image is smaller than or equal to 0.5 nm.

The invention claimed is:
1. An ion beam device comprising:
a gas field ion source, including a vacuum chamber, a vacuum exhaust mechanism, an emitter tip that composes a needle-shaped anode, an extraction electrode that composes a cathode in the vacuum chamber, and a cooling mechanism which cools the emitter tip, for supplying gas molecules to a vicinity of a distal end of the emitter tip and ionizing the gas molecules with an electric field at the distal end of the emitter tip;
an ion beam device main body including a lens system which focuses an ion beam extracted from the emitter tip, a sample chamber incorporating a sample, and a secondary particle detector which detects secondary particles released from the sample; and a mount which supports the ion beam device main body, wherein a vibration proofing mechanism is arranged in a heat transmission path for transmitting heat generated in the cooling mechanism from the cooling mechanism to the emitter tip in the vacuum chamber.

2. The ion beam device according to claim 1, wherein the cooling mechanism comprises a coldness generation means configured to generate cooling by expanding a pressurized gas generated in a compressor unit, and a heat transmission means configured to cool at least the emitter tip with a gas cooled by the coldness generated by the coldness generation means.

3. The ion beam device according to claim 2, wherein the cooling mechanism is a mechanism for cooling at least the emitter tip with an inactive gas cooled by a refrigerator.

4. The ion beam device according to claim 1, wherein the cooling mechanism is a refrigerator, and the vibration proofing mechanism is a gas pot which accommodates a cooling stage of the refrigerator, and wherein the cooling mechanism cools inactive gas in the gas pot with the refrigerator to cool the at least the emitter tip through the cooled inactive gas.

5. The ion beam device according to claim 4, wherein a bellows is arranged between the gas pot and a supporting mechanism of the refrigerator.

6. The ion beam device according to claim 1, wherein the cooling mechanism comprises a coldness generation means configured to generate cooling by expanding a first pressurized gas generated in a compressor unit and circulating means configured to circulate a second pressurized gas cooled with the coldness of the coldness generation means to cool at least the emitter tip.

7. The ion beam device according to claim 2, wherein the cooling mechanism includes a refrigerator and a mechanism which cools at least the emitter tip by circulating a pressurized gas cooled with the coldness of the refrigerator.

8. The ion beam device according to claim 1, wherein the vibration proofing mechanism includes a deformable member which is arranged between the emitter tip and a cooling stage of the cooling mechanism.

9. The ion beam device according to claim 1, wherein the cooling mechanism includes a cooling agent produced by cooling a cooling medium gas, which is in a gas state under normal temperature and atmosphere pressure, to a liquid or solid state, and the vibration proofing mechanism includes a deformable member which is arranged in a heat transmission path between the cooling mechanism and the emitter tip.

10. The ion beam device according to claim 1, further comprising: a base plate for supporting a main body of the ion beam device; a mount which supports the base plate; and a second vibration proofing mechanism which is arranged between the base plate and the main body of the ion beam device, wherein the cooling mechanism is supported by a supporting mechanism fixed to a floor on which the ion beam device is installed or fixed to the mount.

11. The ion beam device according to claim 1, further comprising: an objective lens and a lens, which focus an ion beam extracted from the emitter tip; a sample chamber incorporating a sample; and a secondary particle detector which detects secondary particles released from the sample, wherein an ion beam diameter is focused to 0.5 nm by reducing a distance from a distal end of the objective lens to a surface of the sample to less than 2 mm.

12. The ion beam device according to claim 1, wherein a structural dimension of the sample is measured with an accelerating voltage of the ion beam equal to or greater than 50 kV.

13. The ion beam device according to claim 1, wherein hydrogen gas is used.

14. The ion beam device according to claim 1, wherein an energy of the ion beam is smaller than 1 keV.

15. An ion beam device comprising:

a vacuum chamber;

an extraction electrode for extracting an ion beam;

a gas field ion source which ionizes gas molecules with an electric field at a distal end of an emitter tip;

a cooling mechanism which cools the emitter tip;

a focusing lens system which focuses the ion beam extracted from the emitter tip;

a sample chamber which accommodates a sample;

a charged particle detector which detects a secondary charged particle released from the sample; and a heat transmission section which is coupled with the emitter tip and is configured to transmit heat to the emitter tip, wherein the cooling mechanism is spatially separated from the emitter tip and the heat transmission section, cools a gas to arrange the cooled gas to a space between the cooling mechanism and the heat transmission section, and cools the emitter tip by cooling the heat transmission section through the cooled gas, and wherein a vibration proofing mechanism is arranged in the heat transmission section for transmitting heat generated in the cooling mechanism from the cooling mechanism to the emitter tip in the vacuum chamber.

16. An ion beam device comprising:

a vacuum chamber;

an extraction electrode for extracting an ion beam;

a gas field ion source which ionizes gas molecules with an electric field at a distal end of an emitter tip;

a cooling mechanism which cools the emitter tip;

a focusing lens system which focuses the ion beam extracted from the emitter tip;

a sample chamber which accommodates a sample;

a charged particle detector which detects a secondary charged particle released from the sample; and a heat transmission section which is coupled with the emitter tip and is configured to transmit heat to the emitter tip, wherein the cooling mechanism includes an exhaust section which solidifies a cooling agent by lowering atmospheric pressure and cools the emitter tip by cooling the heat transmission section through the solidified cooling agent.

17. The ion beam device according to claim 16, further comprising a temperature measuring section which measures a temperature of the cooling agent.

* * * * *